US009076637B2

(12) United States Patent
Mori et al.

(10) Patent No.: US 9,076,637 B2
(45) Date of Patent: Jul. 7, 2015

(54) PLASMA PROCESSING METHOD AND PLASMA PROCESSING APPARATUS

(71) Applicant: HITACHI HIGH-TECHNOLOGIES CORPORATION, Tokyo (JP)

(72) Inventors: Masahito Mori, Tokorozawa (JP); Naoyuki Kofuji, Tama (JP); Naoshi Itabashi, Hachioji (JP)

(73) Assignee: HITACHI HIGH-TECHNOLOGIES CORPORATION, Tokyo (JP)

(*) Notice: Subject to any disclaimer, the term of this patent is extended or adjusted under 35 U.S.C. 154(b) by 0 days.

(21) Appl. No.: 14/033,338

(22) Filed: Sep. 20, 2013

(65) Prior Publication Data
US 2014/0116621 A1 May 1, 2014

Related U.S. Application Data

(63) Continuation of application No. 13/212,909, filed on Aug. 18, 2011, now Pat. No. 8,546,266, which is a continuation of application No. 12/068,889, filed on Feb. 13, 2008, now Pat. No. 8,129,283.

(30) Foreign Application Priority Data

Feb. 13, 2007 (TW) ................. 96105248 A
Jan. 10, 2008 (JP) ................. 2008-002709

(51) Int. Cl.
C23F 1/00 (2006.01)
H01J 37/32 (2006.01)
(Continued)

(52) U.S. Cl.
CPC ..... H01J 37/32798 (2013.01); H01J 37/32183 (2013.01); C23F 4/00 (2013.01);
(Continued)

(58) Field of Classification Search
USPC ............ 156/345.23, 345.24, 345.25, 345.26, 156/345.28, 345.29, 345.35, 345.36; 438/706, 712, 714
See application file for complete search history.

(56) References Cited

U.S. PATENT DOCUMENTS 7,658,969 B2   2/2010 Kumar et al.
7,666,464 B2 * 2/2010 Collins et al. ............. 427/8
(Continued)

FOREIGN PATENT DOCUMENTS

JP   2001-267301 A   9/2001
JP   2002-141341 A   5/2002
(Continued)

OTHER PUBLICATIONS

Abraham, I. C., et al., "Ion energy distributions versus frequency and ion mass at the rf-biased electrode in an inductively driven discharge," Journal of Vacuum Science and Technology A 20(5), Sep./Oct. 2002, p. 1759-1768, American Vacuum Society.

(Continued)

Primary Examiner — Lan Vinh
(74) Attorney, Agent, or Firm — McDermott Will & Emery LLP

(57) ABSTRACT

The invention provides a plasma processing apparatus and a dry etching method for etching a multilayered film structure having steps with high accuracy. The plasma processing apparatus comprises a vacuum reactor 107, a lower electrode 113 placed within a processing chamber of the vacuum reactor and having a wafer 112 to be etched mounted on the upper surface thereof, bias supplying units 118 and 120 for supplying high frequency power for forming a bias potential to the lower electrode 113, a gas supply means 111 for feeding reactive gas into the processing chamber, an electric field supplying means 101 through 103 for supplying a magnetic field for generating plasma in the processing chamber, and a control unit 127 for controlling the distribution of ion energy in the plasma being incident on the wafer 112 via the high frequency power.

4 Claims, 15 Drawing Sheets

(51) Int. Cl.
*C23F 4/00* (2006.01)
*H01L 21/311* (2006.01)
*H01L 21/3213* (2006.01)
*H01L 29/51* (2006.01)

(52) U.S. Cl.
CPC .... *H01J 37/32706* (2013.01); *H01L 21/31116* (2013.01); *H01L 21/31138* (2013.01); *H01L 21/32136* (2013.01); *H01L 21/32137* (2013.01); *H01L 29/517* (2013.01)

(56) References Cited

U.S. PATENT DOCUMENTS

| | | |
|---|---|---|
| 8,129,283 B2 | 3/2012 | Mori et al. |
| 2003/0132198 A1 | 7/2003 | Ono et al. |
| 2004/0003896 A1 | 1/2004 | Sugahara |
| 2004/0149384 A1 | 8/2004 | Kanno et al. |
| 2004/0226657 A1 | 11/2004 | Hoffman |
| 2006/0073619 A1 | 4/2006 | Usui et al. |
| 2007/0284044 A1* | 12/2007 | Matsumoto et al. ..... 156/345.29 |

FOREIGN PATENT DOCUMENTS

| | | |
|---|---|---|
| JP | 2002-203835 A | 7/2002 |
| JP | 2002-299322 A | 10/2002 |
| JP | 2004-039772 A | 2/2004 |
| JP | 2005-142582 A | 6/2005 |
| JP | 2005-340760 A | 12/2005 |
| JP | 2005-536834 A | 12/2005 |
| JP | 2007-036139 A | 2/2007 |
| JP | 2007-250755 A | 9/2007 |
| WO | 2004/003963 A2 | 1/2004 |
| WO | 2005/062885 A2 | 7/2005 |

OTHER PUBLICATIONS

Entire Prosecution of U.S. Appl. No. 13/212,909 to Mori et al., filed Aug. 18, 2011, entitled, "Plasma Processing Method and Plasma Processing Apparatus."

Entire Prosecution of U.S. Appl. No. 12/068,889 to Mori et al., filed Feb. 13, 2008, entitled, "Plasma Processing Method and Plasma Processing Apparatus."

* cited by examiner (a)

(b)

PLASMA PROCESSING METHOD AND PLASMA PROCESSING APPARATUS

The present application is a Continuation of U.S. patent application Ser. No. 13/212,909 filed on Aug. 18, 2011 which is a Continuation of U.S. application Ser. No. 12/068,889, filed on Feb. 13, 2008, now U.S. Pat. No. 8,129,283, which is based on and claims priority of Taiwanese Patent Application No. 96105248 filed on Feb. 13, 2007 and Japanese Patent Application No. 2008-002709, filed on Jan. 10, 2008, the entire contents of each of which are hereby incorporated as reference.

BACKGROUND OF THE INVENTION

1. Field of the Invention

The present invention relates to a semiconductor manufacturing method, and more specifically, relates to a plasma processing method and apparatus for forming gate electrodes having a metal gate/high-k structure, a step structure and a three-dimensional structure that demands high selectivity with respect to the underlayer film and mask layer and also demands perpendicular processing.

2. Description of the Related Art

In MOSFET (metal-oxide-semiconductor field-effect transistor) devices used in digital appliances, personal computers and cellular phones, for example, there are continuous demands for improvement in integration, speed and function. In order to cope with these demands, miniaturization of the prior-art Poly-Si/SiO$_2$ structure has been promoted, along with studies for discovering gate electrodes with a new structure and formed of new materials.

According to the principles of dry etching processes used for forming gate electrodes of planar MOSFET and FIN-FET having such metal gate/high-k structure, plasma is generated from reactive gases via electromagnetic waves, and ion assisted reaction is caused by the generated ions and neutral radicals. Therefore, the plasma processing apparatus for performing the above-described method includes a plasma generating mechanism, a reactive gas supplying mechanism, a pressure control mechanism, a lower electrode mechanism for placing the Si wafer, a Si wafer transfer mechanism, and a mechanism for controlling the operation timings or the like of each mechanism. The lower electrode mechanism is further composed of an electrostatic chuck mechanism for holding the Si wafer, a temperature control mechanism for the Si wafer, and a bias supplying mechanism.

In the method for controlling an ion energy distribution function (IEDF) using a plasma processing apparatus having mechanisms mentioned above, the waveforms and frequencies of the bias being supplied are known to influence the process. For example, Japanese Patent Application Laid-Open Publication No. 2002-141341 (patent document 1) discloses a method for supplying a pulse-like bias and a method for supplying a dual frequency bias having a low frequency of 25 kHz or lower and a high frequency of 2 MHz or higher, in order to improve the etching selectivity with respect to Si when etching a dielectrics. It is further disclosed in Journal of Vacuum Science and Technology A Volume 20 p. 1759 (non-patent document 1) that the frequency output by the bias mechanism has an IEDF depending on the time required to pass through the plasma sheath.

On the other hand, Japanese Patent Application Laid-Open Publication No. 2007-250755 (patent document 2) discloses a monitor for detecting the state of plasma, by which the voltage, current and phase of the high frequency waves are monitored to detect defects such as the insulation degradation of the inner walls of the chamber or the insulating film of the lower electrode.

When a multilayered metal gate/high-k gate electrode having an STI step 310 as shown in FIG. 3A is dry-etched in a prior-art plasma processing apparatus, it was difficult to simultaneously prevent underlayer penetration 312 of the high-k gate dielectrics and prevent the occurrence of a footing 314 so as to achieve a perpendicular bottom shape. Similar drawbacks related to underlayer selectivity, perpendicular processing and isolated-dense shape differences caused by the sparseness and denseness of the wiring disposed on the substrate are even more crucial in the etching of FIN-FET gates. Etched feature profile differences such as the underlayer penetration at the upper portion of the step of the FIN with a size of approximately 50 nm, the side-etch of the upper portion of the gate length portion or the footing formed at the bottom portion become the cause of the variation of CMOS performance.

SUMMARY OF THE INVENTION

The object of the present invention is to provide a plasma processing method or a plasma processing device capable of realizing improved underlayer selectivity and stable perpendicular processing when dry-etching a gate electrode material composed of multiple layers including metal materials and high-k materials and having an STI structure or a three-dimensional gate structure such as FIN-FET.

The above object is realized by a plasma processing apparatus comprising a vacuum reactor, a lower electrode placed within a processing chamber of the vacuum reactor and having a wafer to be etched placed on the upper surface thereof, a bias supplying mechanism for supplying bias power of multiple frequencies for forming a bias potential in the lower electrode, a gas supply mechanism for supplying reactive gas into the processing chamber, a mechanism for controlling the gas pressure in the processing chamber, and an electromagnetic wave feeding mechanism for generating plasma in the processing chamber, wherein the plasma processing apparatus further comprises an IEDF control mechanism for independently changing the energy of ions being incident on the wafer and IEDF, and a mechanism for detecting the plasma status with respect to the bias frequency.

The plasma processing apparatus further characterizes in that the IEDF control mechanism is composed of a power supply unit for oscillating a plurality of frequencies and respective matching units, and the mechanism for detecting the plasma status is provided with a mechanism for detecting the plasma impedance of the respective frequencies from the bias supplying mechanism.

Furthermore, the above object is achieved by a plasma processing method comprising a step of placing a wafer having a multilayered structure including a metal material disposed on a high-k material and having a film structure with a step on a lower electrode in a processing chamber inside a vacuum reactor, a step of supplying an etching gas into the processing chamber, a step of controlling processing pressure, a step of generating plasma in the processing chamber, a step of supplying a bias power having one or more frequencies for forming a bias potential on the wafer, and a step of etching the layered structure by varying the output of the bias power, wherein the method further comprises a step of detecting the time variation of the plasma impedance from the bias supplying mechanism, a step of detecting the end point of the process based on the detected result, and after determining the end point, a step of independently controlling the ion energy being incident on the wafer and the distribution of the ion energy.

Moreover, the step of independently controlling the ion energy being incident on the wafer and the distribution thereof includes varying the output and the mixing ratio of the bias power of a plurality of frequencies, and isolating the impedances of a component representing the wall surface status and a component above the wafer after the step of detecting the time variation of the plasma impedance, wherein the isolated data is compared either with a database or with a fluctuation model, and the method further comprises a step of cleaning the wall surface or a step of changing the wafer processing condition for the subsequent wafer processing based on the compared result.

BRIEF DESCRIPTION OF THE DRAWINGS

FIG. 3 is a cross-sectional view of a planar CMOS-FET having a multilayered structure including a step, a metal material and a high-k material, wherein

FIG. 10 is a pattern diagram of the cross-sectional shape of a hard mask sample being etched, wherein

FIG. 12 is a view of a sample having a FIN-FET structure processed according to the present invention, wherein

DETAILED DESCRIPTION OF THE PREFERRED EMBODIMENTS

Figure 3A:
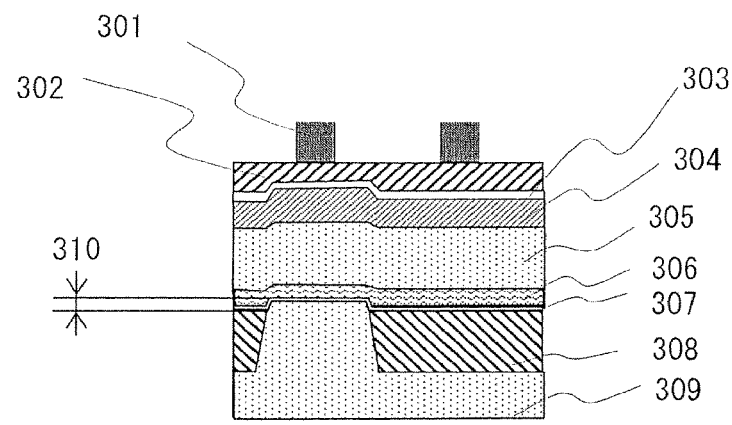
FIG. 3A is a cross-sectional view prior to etching.

Now, the preferred embodiments of the present invention will be described with reference to the drawings. First, an example of a layered structure to be processed according to the present embodiment will be described with reference to FIG. 3. FIG. 3A is a cross-sectional view of a planar CMOS sample having a metal gate/high-k structure prior to performing the etching process, FIG. 3B is a cross-sectional view after performing etching according to a prior art method, and FIG. 3C is a cross-sectional view after performing etching according to the present invention.

In FIG. 3A, the wafer is composed of an STI 308 formed on a Si substrate 309, a HfSiON (high-k) gate dielectrics 307 formed on the Si substrate 309 and the STI 308, a metal gate electrode layer 306 formed on the high-k gate dielectrics 307, a gate Cap layer 305, a lower mask 304, an intermediate mask 303, a BARC (antireflection film) layer 302, and a resist 301 formed in the named order from the lower layer. When such illustrated planar multilayered metal/high-k gate electrode having an STI step 310 created by the formation of STI 308 is etched in a prior art gate etching apparatus having a single bias frequency of 400 kHz using $Cl_2$/HBr gas, a underlayer penetration 312 of the HfSiON (high-k) film occurred at the lower area 311 of the gate electrode which is the active portion for forming a MOS-FET, as shown in FIG. 3B. Further, a residual portion 313 of the gate electrode material of the STI step portion was formed in a footing at the corner of the STI step 310. On the other hand, there were no underlayer penetration at the lower portion of the gate which constitutes the field portion for wiring, but footings 314 and etching residues 315 of the gate electrode material on the STI remaining on the STI surface were created.

In other words, in the etching of the multilayered metal/high-k gate electrode, it was difficult to simultaneously improve the selectivity of the base high-k material near the gate electrode and prevent the formation of footings.

Figure 3B:
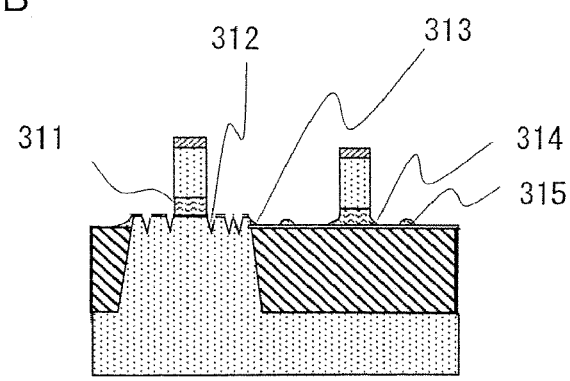
FIG. 3B is a cross-sectional view according to a prior art etching method.
Figure 3C:
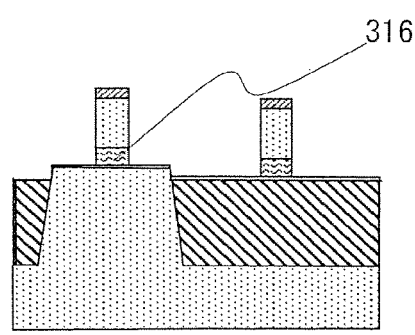
FIG. 3C is a cross-sectional view etched by the present invention.

The reason why it is difficult to improve the underlayer selectivity and prevent the formation of footings using a 400 kHz bias as shown in FIG. 3B is because the ion energy distribution function (IEDF) has an extensity centering around an average energy, and the end point detection of the etching process of a material that is optically non-transparent and thin tends to be delayed.

Figure 2:
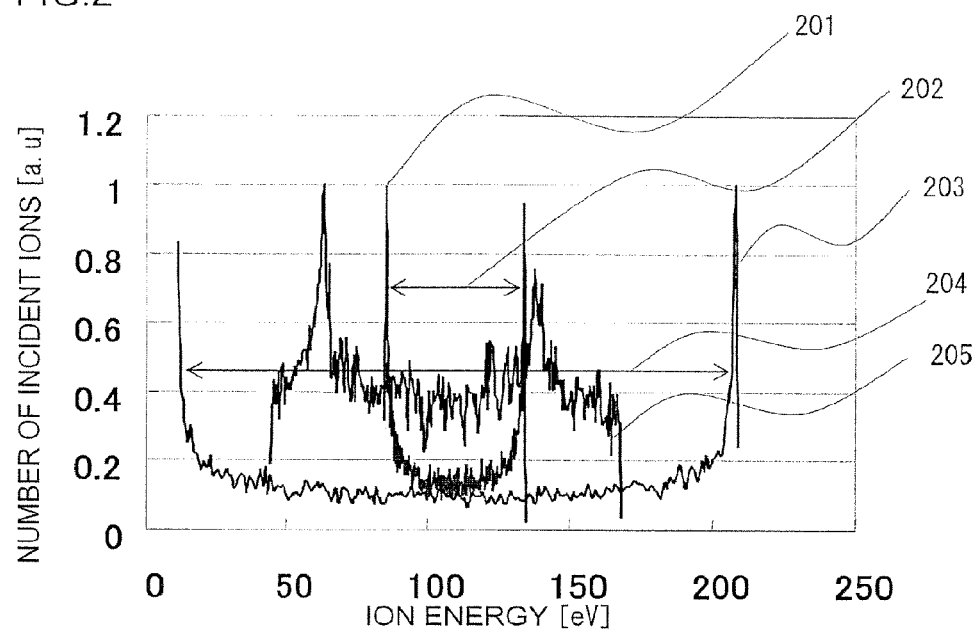
FIG. 2 is a graph showing the IEDF of a dual frequency mixed bias of 400 kHz and 13.56 MHz.

FIG. 2 shows an example of the ion energy distribution in which the distribution differs for the same time-average ion energy. FIG. 2 is a pattern diagram of a plurality of IEDFs when an RF of Vpp=200 V of frequencies of 400 kHz and 13.56 MHz is supplied on a wafer under a plasma condition in which the electron temperature is 3 eV, the mass number of incident ions is 79.9 and the plasma density is $1 \times 10^{10}$ $cm^{-3}$. The IEDF 203 of 400 kHz has a distribution width 204 of approximately 200 eV with respect to the time average of 100 eV, and has two peaks near 0 V and 200 V. On the other hand, the IEDF 201 of a high frequency of 13.56 MHz has a distribution width 202 as narrow as approximately 50 eV. The IEDF 205 having mixed 100 Vpp of low frequency and 100 Vpp of high frequency has an intermediate distribution. This is because the cycle of sheath voltage oscillation accelerating ions becomes faster as the bias frequency becomes higher, and the sheath oscillation time becomes smaller than the time required for ions to pass through the sheath, according to which ions not capable of following the sheath oscillation are accelerated by the average of the oscillated sheath voltage.

As described, when etching is performed by a frequency of 400 kHz, the high energy ions having energy that is approximately dual the time-average ion energy deteriorates selectivity, whereas the low energy ions of approximately 0 eV causes footings, and thus it was difficult to solve both problems. Therefore, in order to realize selectivity and prevent the formation of footings, it is preferable to use high frequency waves and to narrow the ion energy distribution. On the other hand, the wide distribution created by using low frequency waves should preferably be used, for example, to physically sputter a surface alteration layer by high energy ions or to etch the insulating layer with the high energy ions. Further, the use of low frequency waves can be desirably used to utilize the high energy ions having a wide distribution with respect to the average ion energy without being influenced by the dissociation or distribution of plasma. As described, when a multilayer is to be etched consistently, it is necessary that the IEDF is controlled.

On the other hand, the delay of end point detection which is the other cause of the defective shape shown in FIG. 3B is caused by the necessity of having to reduce the etching speed in order to process the thin gate electrode having a thickness as thin as approximately 10 to 30 nm. In other words, according to the prior art method using emission spectroscopy, when the etching speed is slow, the composition ratio of reaction products in the plasma becomes small, which means that the emission intensity in the plasma is small and the change thereof is insignificant.

Further, when the end point detection is performed according to the prior-art film thickness interference method, the thickness of the gate electrode subjected to etching is small with respect to the ¼ wavelength of the light source wavelength of 200 to 800 nm to be detected, and the cyclic pattern is difficult to discover. Further, due to surface roughness of the gate electrode material and the base high-k material which is as thin as 2 nm and often not uniform, the intensity of the interference waveform becomes small, leading to error in reduced film thickness and deteriorated repeatability. Moreover, since the intensity of the interference waveform depends on the area to be etched within the solid angle of the detector, the end point detection becomes even more difficult in patterned wafers.

On the other hand, the method for detecting the electric properties of plasma used in the present invention is sensitive to the capacitance change in the plasma sheath above the wafer in which the density of reaction products is high, the detection is made possible even if the initial film thickness is small and even if there is surface roughness. Furthermore, with respect to stable operation of the apparatus, the impedances of the high and low frequencies above the wafer are detected in order to isolate the change of wall surface status of the plasma from the change above the wafer upon performing the end point detection.

Generally, when the bias to be supplied to the plasma is expressed as an equivalent circuit, the bias can be expressed in the following equations (1) and (2) as an electrical circuit composed of not only the impedance ($Z_{1y}$, y=H, L) of the sheath above the wafer of the high frequency angular speed $\omega_H$ and the low frequency angular speed $\omega_L$, but also the impedance ($Z_{2y}$, y=H, L) of the sheath formed on the wall surface of the chamber. In the equations, voltage and current at the time when high frequency bias power of high frequency is supplied is represented by $V_H$ and $I_L$, respectively, and voltage and current at the time when high frequency bias power of low frequency is supplied is represented by $V_L$ and $I_L$, respectively. Resistance component, reactance component, inductance component, and capacity component of the component above the wafer is respectively represented by $R_1$, $X_1$, $L_1$ and $C_1$. Resistance component, reactance component, inductance component, and capacity component of the component representing the wall surface status of the processing chamber is respectively represented by $R_2$, $X_2$, $L_2$, and $C_2$. In other words, the monitored values of the voltages ($V_{1y}$, y=H, L), currents ($I_{1y}$, y=H, L) and phases for the different frequencies are detected, and by solving the real part and the imaginary part of the simultaneous equations of equation (1) for the high frequency, equation (2) for the low frequency and equation (3) representing the relationship between impedance and frequency, it becomes possible to isolate the impedance information on the sheath above the wafer and the sheath formed on the wall surface of the chamber.

[Equation 1]

$$\begin{cases} Z_{1H}I_H + Z_{2H}I_H = V_H & (1) \\ Z_{1L}I_L + Z_{2L}I_2 = V_L & (2) \end{cases}$$

[Equation 2]

$$Z_{xy} = R_x + j\left(\omega_y L_x - \frac{1}{C_x \omega_y}\right) \quad (3)$$

$$= R_x + jX_{xy}$$

$$x = 1, 2; \, y = H \text{ or } L$$

The present invention has been invented based on the findings that various types of impedances can be isolated and detected through a plurality of frequencies, and according to the preferred embodiments described hereafter, drawbacks of defective shapes such as isolated-dense shape differences, notching, side-etch, underlayer damage, footings, underlayer penetration and tapered profiles which are created when etching a multilayered gate of a planar CMOSFET having a stepped structure can be solved by using a plasma processing apparatus having an ion energy distribution function (IEDF) control mechanism of plural frequencies and a bias supplying mechanism having a plurality of plasma impedance monitors.

[Embodiment 1]

Figure 1:
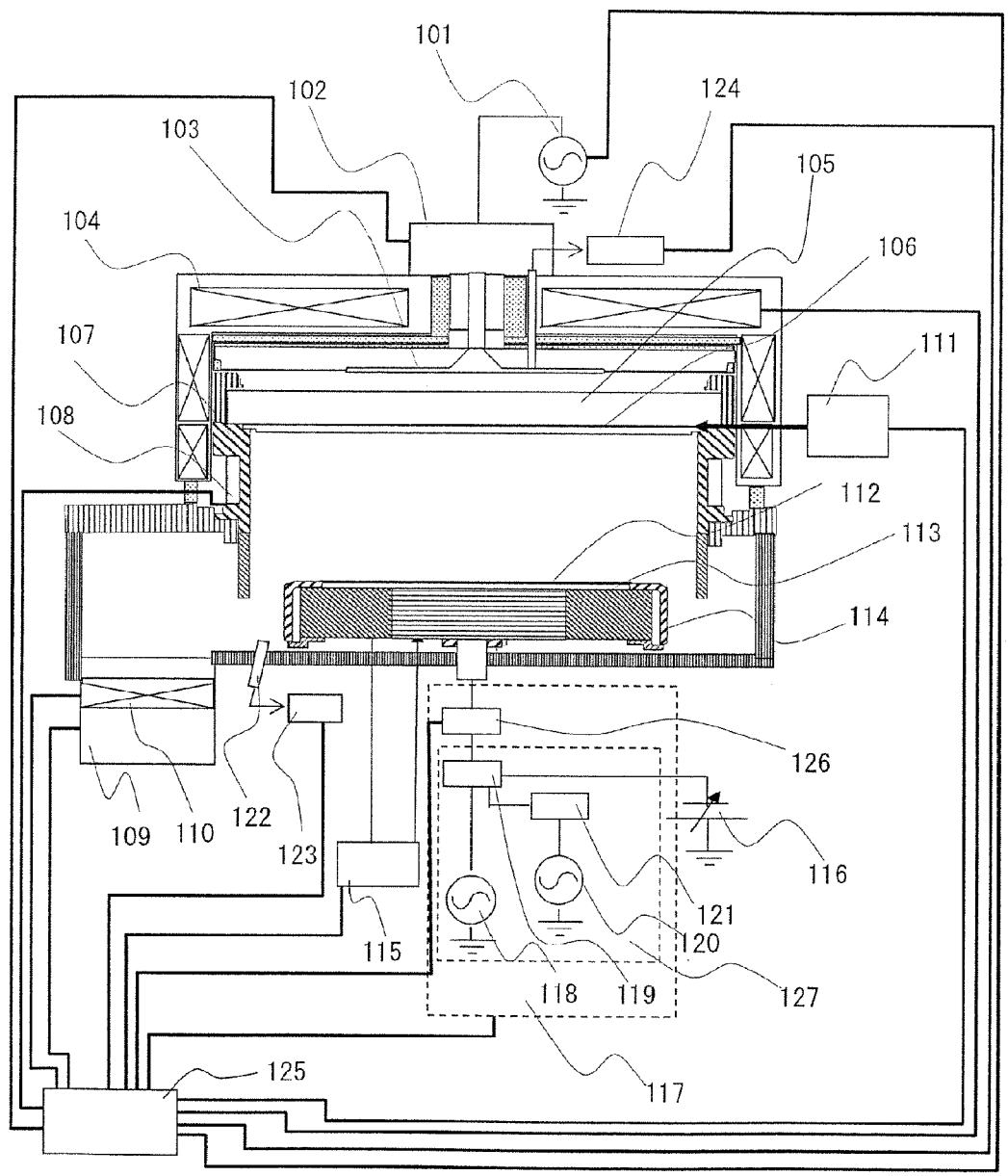
FIG. 1 is a cross-sectional view of a plasma processing apparatus according to a preferred embodiment of the present invention.

First, a preferred embodiment of an apparatus for realizing the present invention will be described. FIG. 1 is a vertical cross-sectional view showing the outline of the structure of a plasma processing apparatus according to a preferred embodiment of the present invention. In the plasma processing apparatus shown in the drawing, plasma is generated inside a processing chamber arranged in the interior of a vacuum reactor, and a etched sample, such as a silicon wafer, placed in the processing chamber is processed using the generated plasma. The plasma generating mechanism of the apparatus is composed of a UHF power supply 101 of 450 MHz, a high-speed response UHF matching box 102 having an impedance monitor, an antenna 103 and an electromagnet 104.

The antenna 103 for radiating UHF waves into an etching chamber 107 constituting a vacuum reactor is disposed on an atmospheric side of a quartz plate 105 for maintaining vacuum. The etching gas is passed through a high-speed response reactive gas supply mechanism 111 composed of a mass flow controller and a stop valve and capable of changing the gas flow rate in a few seconds, in which the etching gases are mixed, and then fed through a shower plate 106 into the etching chamber 107. The gas pressure during etching can be controlled by a high-speed response pressure control mechanism 110 disposed above a high vacuum pump 109.

The lower electrode 113 on which an Si wafer 112, which is the material subjected to etching, is to be placed is equipped with a substantially ring-shaped susceptor 114 disposed to cover the outer circumference and the side wall of the upper mounting surface of the lower electrode 113 on which the Si wafer 112 is placed, and is concentrically divided thermally into two or more parts, wherein the temperatures of the respective parts of the lower electrode can be controlled to a determined temperature using a temperature control mechanism. 115. During the etching process, the wafer 112 is fixed via electrostatic chuck using a direct current voltage of −2000 V to +2000 V generated by a direct current power supply 116, and Helium is filled in the space formed between the Si wafer 112 and the lower electrode 113 so as to perform pressure control. The application of such electrostatic chuck method enables to control the temperature of the Si wafer 112 during etching.

Further, the lower electrode 113 is connected to a bias supplying mechanism 117 for drawing ions in the plasma toward the wafer 112 and controlling the ion energy distribution thereof. The bias application mechanism 117 is composed of an IEDF control mechanism 127 for controlling the incident ion energy distribution and a plasma impedance monitor (hereinafter also referred to as PIM) 126. The present embodiment utilizes as the IEDF control mechanism 117 a system having a power supply for generating and supplying power of a plurality of frequencies, which is composed of a low frequency bias power supply unit 120, a low frequency matching box 121, a high frequency bias power supply unit 118 and a high frequency matching box 119. The low frequency bias power supply unit 120 utilizes a frequency of 400 kHz, the high frequency bias power supply unit 118 utilizes a frequency of 13.56 MHz, and each power supply unit is capable of outputting power corresponding to a minimum of approximately 1 W and a maximum of approximately 150 W (continuous sinusoidal)/12 inch diameter, and including a time modulate (hereinafter also referred to as TM) function capable of performing an on-off modulation in the range of 500 Hz to 3 kHz (having a maximum power of approximately 500 W during modulation).

At this time, the high frequency matching box 119 and the low frequency matching box 121 are required to have sensitivity capable of performing matching for a minimum output as small as 0.5% or greater of the maximum output or 1 W. On the other hand, by arranging a plasma impedance monitor 126 between the IEDF control mechanism 127 and the lower electrode 113, the plasma impedance monitor 126 can detect the time variation of voltage, current and phase with respect to the respective frequencies, or in other words, the change of impedances including the time variation of electron density and electron temperature.

According to the plasma processing apparatus of the present embodiment, an emission detector 122 for receiving the plasma emission during the etching process is disposed for example at the lower area of the reactor constituting the etching chamber 107. The output from the emission detector 122 is sent to an emission spectrometer 123.

Further, a film thickness interference monitor 124 for detecting the film thickness on the surface of the Si wafer by receiving the interference light in the plasma or from an external light source is disposed to face the Si wafer 112 placed on the lower electrode 113. Further, on the outer side wall of the etching chamber 107 is disposed a heater 108 for controlling the temperature of the etching chamber 107 before, during and after plasma processing to appropriate temperatures.

Further, the plasma processing apparatus according to the present embodiment includes a control unit 125 for controlling the output of each unit and the timings thereof based on values set in advance, receiving the output from sensors detecting the operations of the respective units arranged for each unit, performing computation based on the received results, and reading data from the storage unit and outputting operation orders to each unit. The control unit 125 is capable of communicating with the UHF power supply 101, the high-speed response UHF matching box 102 with an impedance monitor, a heater 108, a vacuum pump 109, a high-speed response pressure control mechanism 110, a high-speed response reactive gas supply mechanism 111, a temperature control mechanism 115, an IEDF control mechanism 127 and a high frequency bias power supply unit 118 disposed in the interior thereof, an emission spectrometer 123, a film thickness interference monitor 124 and a plasma impedance monitor 126, wherein the control unit 125 receives output from these units and transmits operation signals thereto. For example, the control unit 125 receives output from the plasma impedance monitor 126, the emission spectrometer 123 or the film thickness interference monitor 124 to detect the status of the process such as the Si wafer thickness or the end point of the process, and based on the detected result, computes and outputs operation signals to the IEDF control mechanism 127, the UHF power supply 101, the high-speed response UHF matching box 102 with an impedance monitor, the heater 108, the vacuum pump 109, the high-speed response pressure control mechanism 110, the high-speed response gas supply mechanism 111 and the temperature control mechanism 115 in order to control the operation. The high-speed response UHF matching box 102 with an impedance detector functions as a matching unit that stores plural matching points with respect to the UHF power supply 101 and selects the matching path to perform matching.

An example of etching a thin metal gate electrode layer 306 (TiN) having a thickness of 10 to 30 nm in a planar MOS having an STI step 310, an ArF resist 301/BARC 302/intermediate mask 303/lower mask 304/gate Cap layer 305/metal gate electrode layer 306/HfSiON gate dielectrics 307 structure as shown in FIG. 3A using the plasma processing apparatus of FIG. 1 according to the present invention will now be described using the time chart of FIG. 4.

After etching the layers from BARC 302 to gate Cap layer 305 in a single chamber, a break-through (hereinafter also referred to as BT) step of the TiN (metal gate electrode layer) 306 is performed. The aim of the BT step is to remove a TiO surface layer preventing TiN etching, which has been formed by the BARC 302 being over-etched (hereinafter also referred to as OE) and bonding with oxygen. The conditions of the BT step are as follows: Ar of 100 to 200 ccm; pressure of 1 Pa; UHF supplying power of 500 W; a low frequency bias of 400 kHz; and a bias low frequency supplying power of 50 to 100 W. By using a low frequency bias of 400 kHz, it becomes possible to easily achieve a high energy required to remove the TiO.

Figure 4A:
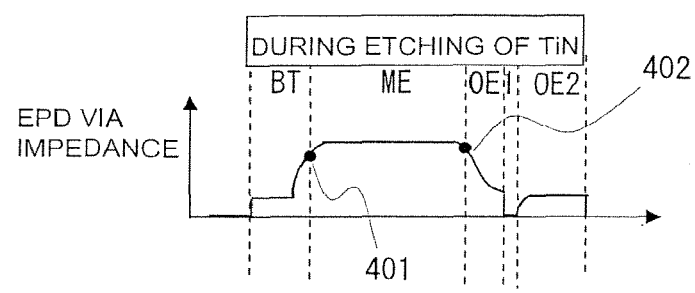
FIGS. 4A-AC are views showing the time sequence of an electric end point detection and dual frequency bias used for processing the Si wafer having the cross-sectional structure of FIG. 3A and a comparison of timing according to the prior-art end point determination method.
Figure 4B:
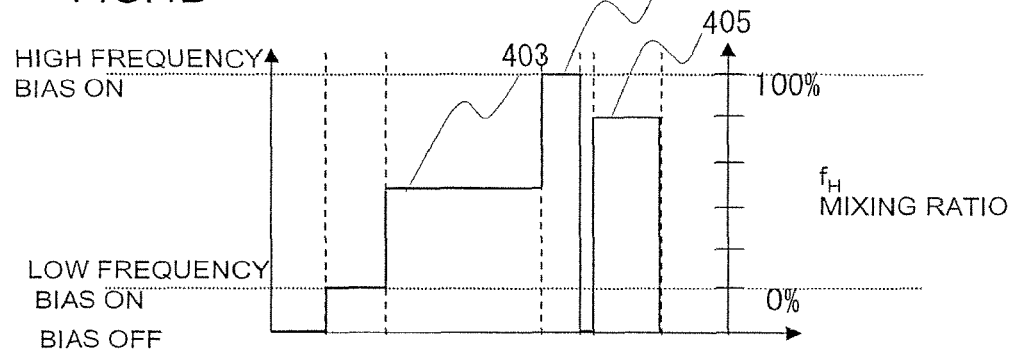
Figure 4C:
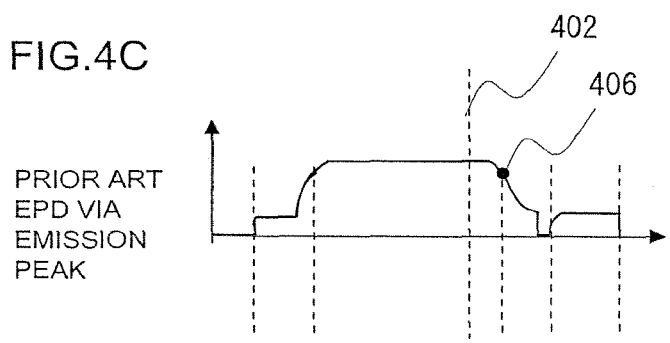

FIG. 4A shows an end point detection (EPD) by time variation of the impedance of the result detecting the voltage, current and phase via a plasma impedance monitor corresponding to a frequency of 400 kHz in the plasma impedance monitor 126. As the BT step of TiN proceeds, the surface TiO is removed and the Ti and N are released near the plasma sheath, causing the electron density, sheath thickness or other electric properties to be varied. At a time 410 when the impedance is increased, the process is advanced to main etching (hereinafter also referred to as ME).

In the ME step of TiN 306, HBr, $NF_3$, $CF_4$ and $SF_6$ are added to a base gas of $Cl_2$ or HCl, and the process is performed under a condition in which the pressure is 0.2 Pa and the UHF supplying power is 500 W. As for the bias of the ME step of TiN, a 13.56 MHz high frequency bias is mixed with a ratio of 50% to the 400 kHz low frequency bias (FIG. 4B, dual frequency mixture ratio 403 during ME of TiN). The aim of this setting is to suppress residual footings by suppressing the number of low energy ions which is the advantage of supplying high frequency bias while obtaining anisotropic profiles by high energy ions which is the advantage of supplying low frequency bias, and to isolate the impedance of the sheath formed on the chamber wall surface from the sheath formed above the wafer so as to realize highly accurate end point detection based on the impedance formed above the wafer. In the end point detection of the ME step, the process was switched to an OE1 step of TiN at a time 402 when the plasma impedance detected by the plasma impedance monitor 126 has started to change, and the output 404 of the IEDF control mechanism 127 was processed by using 100% high frequency bias power. This is because in the subsequent OE1 step, the etching quantity varying according to STI steps, film thickness, pattern density differences of the circuit, the difference of material or area to be etched must be controlled, and in a pattern having portions etched to reach the underlayer, etching must be performed to etch the portions not having reached the base while maintaining selectivity with the base high-k material.

At this time, by using signals from the plasma impedance monitor 126, the endpoint of the ME can be acquired one to five seconds earlier than the end point 406 acquired by the prior art method detecting the time variation of the emission peak of reaction products or etchants, and it becomes possible to reduce the damage by ions to the base high-k layer.

Thereafter, at a timing when the signals from the plasma impedance monitor 126 are stabilized, the procedure is advanced to OE2 step. The plasma conditions of the OE2 step are as follows: $HBr/O_2$ diluted by Ar; a total flow rate of 200 to 400 cc; a pressure of 3 to 10 Pa; and a UHF high frequency power supply 101 output of 500 to 700 W. A mixed bias power of 80% high frequency bias power and 20% low frequency bias power is used (FIG. 4C, dual frequency mixture ratio 405 during OE2 of TiN). These conditions are selected with an aim to maintain underlayer selectivity and reduce footings of the stepped portion of STI and portions without openings, while reducing electron shading damage. In other words, by mixing a small amount of high ion energy that is almost dual the average ion energy, it becomes possible to reduce footings while maintaining selectivity and suppressing physical damage caused by ion bombardment. In other words, it becomes possible to reduce the source-drain recession. Further, by neutralizing the charged ions on the upper portion of the mask by low energy ions, it becomes possible to prevent the occurrence of notching caused by electron shading.

As described, through application of the present invention, it becomes possible to process metal gate electrodes perpendicularly without causing underlayer penetration.

Other than the gate electrode structure of the present embodiment, equivalent effects as the present invention can be obtained when processing other insulating materials such as $ZrO_2$, $Y_2O_3$, $La_2O_3$, $LaAlO_x$, $LaSiO_x$, $Al_2O_3$, $HfO_2$ and HfAlO(N) as high-k material, or metal materials other than TiN, such as TaN, TaSiN, TaC, Ru, HfN and MoN as metal gate electrode layer.

According to the above embodiment, the IEDF control mechanism 127 is composed of power supply units 118 and 120 and matching units 119 and 121 for oscillating two different frequencies. This method is advantageous compared to other IEDF control using, for example, a clip bias, in that the structure of the power supply and matching boxes is simple. When a clip bias power supply are used as a bias supplying mechanism 117, the arrangement becomes more expensive and complex. But it can be realized by providing a plasma impedance monitor 126 having a continuous frequency range, because clipping waveform is achieved by superposing a plurality of continuous frequencies.

Further, the control of the mixing ratio according to the present embodiment is performed using each Vpp as a controlling IEDF, because Vpp had large relation to the voltage accelerating ions. But this control can also be performed using not only Vpp but also the ratio of output power. At this time, however, it must be put into consideration that output power is a multiplication of current and voltage, and that the Vpp value varies according to the arrangement and area of the earth. In another example, it becomes possible to control the output of each power supply to realize a desired energy distribution using a calculation model as shown in FIG. 2. At this time, it becomes possible to improve the control accuracy by providing system for detecting the plasma density, electron temperature required for calculating the energy distribution.

In the present embodiment, a bias power supply of a high frequency of 13.56 MHz and a low frequency of 400 kHz is used, since basically the difference between the two frequencies must be great so as to realize a wide IEDF control range, which is also preferable from the viewpoint of isolation of the impedance of the chamber wall surface from the impedance above the wafer. Further, in order to utilize the higher harmonics of the respective frequencies, it is preferable that the frequencies are not integral multiples. At this time, in order to maintain independent from plasma generation and to maintain a good plasma uniformity, the frequency of the higher frequency should preferably be lower than the frequency of the plasma generation mechanism. For example, in the case of an ECR, the frequency must be 4 MHz or greater and 100 MHz or smaller, since when the frequency exceeds 100 MHz, the independent controllability of ion energy and plasma density is deteriorated. On the other hand, as for the lower frequency, the frequency should not be smaller than 100 kHz, since it causes charge-up on the insulating layer above the Silicon wafer. Therefore, it is desirable to combine a low frequency of 100 kHz or greater and smaller than 4 MHz, and a high frequency of 2 MHz or greater and smaller than 100 MHz, with as much difference as possible. Further, the mixed frequency bands also depend on the plasma generating mechanism. For example, in a plasma generating mechanism using magnetic field for distribution control as in the present embodiment, a high frequency of 13.56 MHz is used in consideration of the influence of cross impedance of E×B. As for ICP and CCP, for example, it is possible to utilize a frequency of 27.60 MHz considering the plasma source frequency.

[Embodiment 2]

In embodiment 1, the end point was detected according to the absolute value of impedance during processing of a single wafer assuming that the impedance of the wall surface status is not varied. However, in mass production of ULSI devices, the processing status will be subjected to drift of chamber condition due to the variation of chamber wall condition. The present embodiment relates to isolating the variation of chamber wall condition status for detecting the end point. If the end point detection is performed with a 50% mixture ratio of two frequencies in the ME of TiN, as shown in the end point detection flow of FIG. 5, a step 501 for detecting impedance with respect to a plurality of frequencies is followed by a step 502 for isolating the impedance of the wall surface from the impedance above the wafer based on equations (1) (2) and (3), which is followed by a step 503 for performing end point detection, by which the output of the IEDF control mechanism 127, the UHF power supply 101, the high-speed response pressure control mechanism 110, the high-speed response reactive gas supply mechanism 111 and the temperature control mechanism 115 are changed. A pattern diagram of the endpoint detection used at this time is shown in FIG. 6.

Figure 6A:
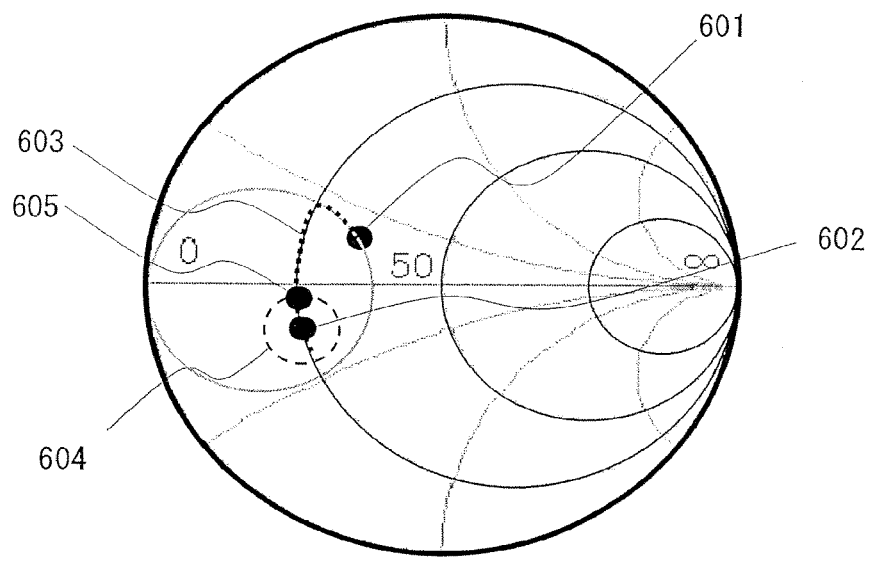
FIG. 6A is an immittance chart of the portion above the wafer for endpoint detection according to the present invention.

FIG. 6A is a view in which the change in complex impedance above the wafer having removed the change in complex impedance of the wall surface after the isolation step is plotted on an immittance chart. For example, a case is considered in which an impedance 602 prior to end point detection is changed to an impedance 601 corresponding to when the etching film is removed completely. When a matching path 603 is composed of tuning condensers and tuning coils that depend on the matching box, the endpoint detection is performed at a time at point 605 where the set complex impedance range 604 had been passed.

Figure 6B:
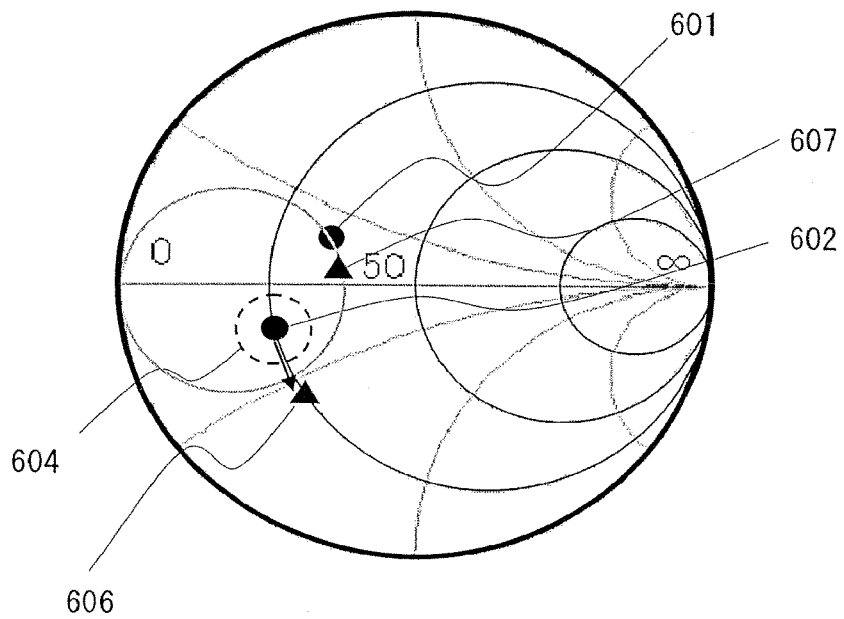
FIG. 6B is an immittance chart of a single frequency.

On the other hand, FIG. 6B is a pattern diagram in which the impedance change detected by a single bias frequency according to the prior art method is plotted on the immittance chart. When drift of chamber condition occurs, the chamber wall surface impedance varies (606) as the etching time increase, and the impedance exceeds a set impedance range 604 before performing end point detection, by which end point detection becomes impossible. This drawback is overcome by the present invention including a step in which impedance is detected by multiple frequencies and the impedance of the wall surface is isolated from the impedance above the wafer, according to which the wafer end point can be acquired stably without being influenced by the wall surface status, and that by combining the process with IEDF control, it becomes possible to stably achieve a desirable etching shape of a metal gate/high-k structure without underlayer penetration and footings.

Figure 5:
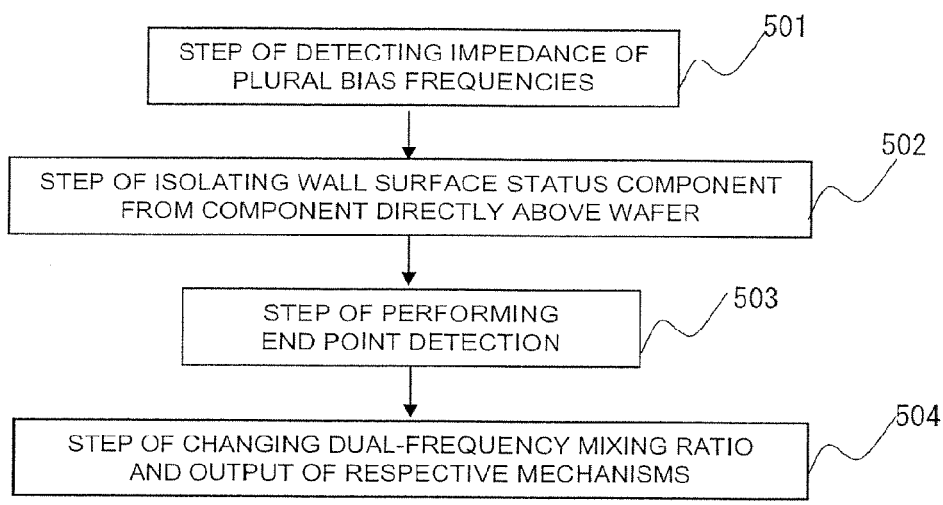
FIG. 5 is a flowchart of the endpoint detection according to the present invention.

The flow of FIG. 5 is executed by a control program in the control unit 125 or by a control software installed in the plasma impedance monitor 126. According to the present embodiment, the end point detection was performed for the metal gate electrode layer (TiN) 306 having a large impact on the device performance out of the multiple layers of the cross-sectional structure of the sample shown in FIG. 3A, but the end point detection can be supplied to detect the end point for other layers such as the BARC 302, the intermediate mask 303, the lower mask 304 and the gate Cap layer 305.

[Embodiment 3]

Figure 7:
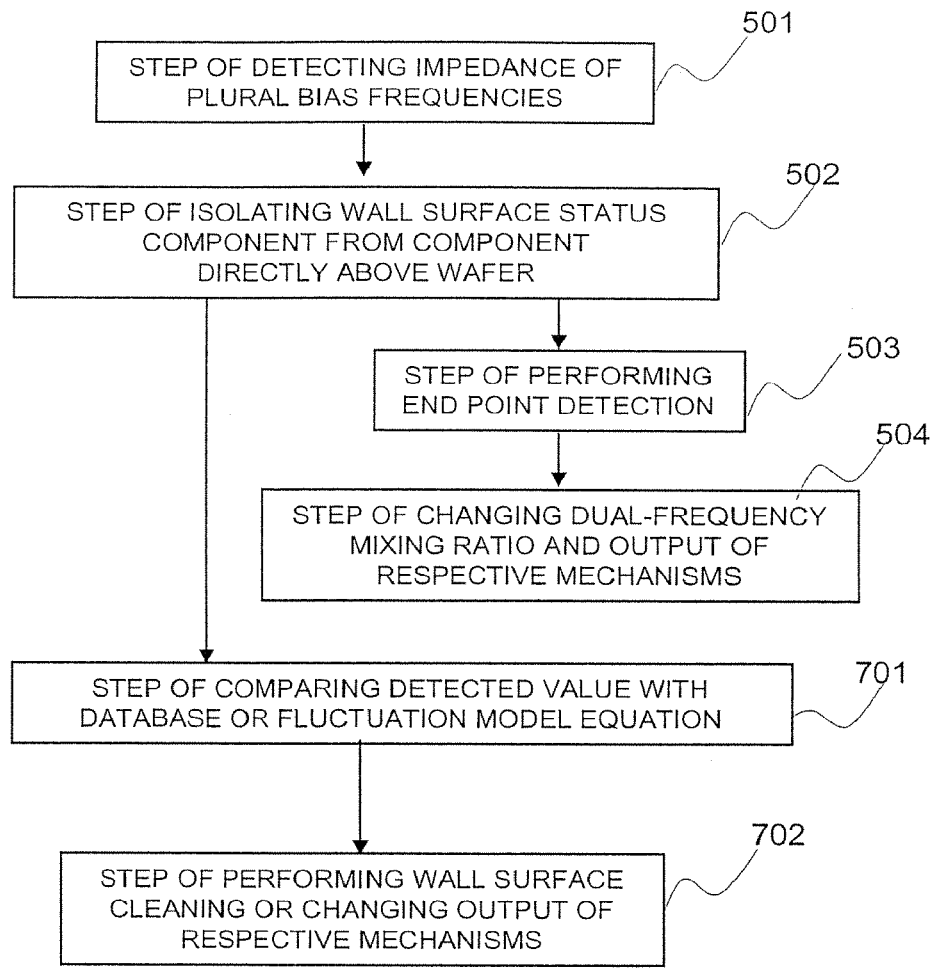
FIG. 7 is a flowchart for performing stabilization and fluctuation correction according to the present invention.

An embodiment for utilizing the changes in the isolated impedance of the chamber wall surface and impedance above the wafer will now be described. FIG. 7 is a flowchart of the end point detection step of ME of TiN of the case where the etching process of a metal gate/high-k gate electrode shown in FIG. 3A is performed for multiple wafers. In the manner shown in embodiment 2, a step 501 for detecting impedance with respect to a plurality of frequencies is followed by a step 502 for isolating the impedance of the wall surface from the impedance above the wafer using equations (1) (2) and (3), which is followed by a step 701 for comparing the isolated impedance of the chamber wall surface and the impedance above the wafer with a state of the same step in the past, that is, data related to past impedance changes and fluctuation model equation.

In the comparison step 701, the currently progressing impedance, current, voltage and phase are stored in a database, which are compared with the past data to classify the drift of chamber condition in wafer to wafer. Based on the classification, the chamber wall condition is detected and a step 702 is executed to perform cleaning so as to reset the drift of chamber wall condition or to control the output value of the respective units appropriately so as to compensate for the change, according to which the isolated impedance information can be utilized to suppress the drift of chamber condition.

Figure 8A:
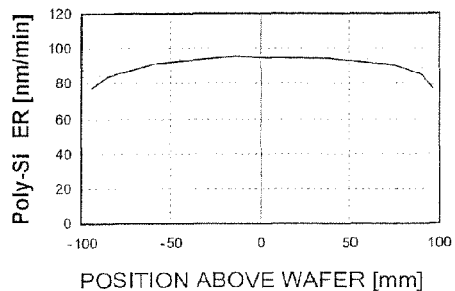
FIGS. 8A, 8B and 8C are charts showing the poly-Si rate distribution when the mixing ratio of low frequency and high frequency are set to 0%, 20% and 100%, respectively.
Figure 8B:
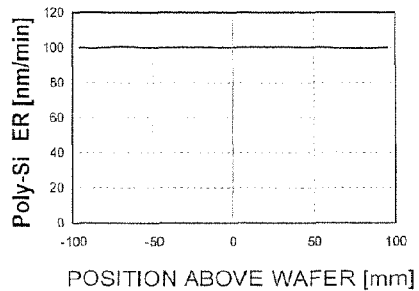
Figure 8C:
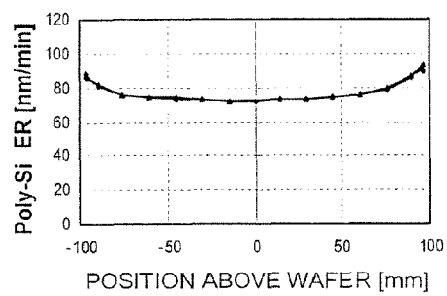

For example, if the voltage, current, phase or impedance of only the high frequency bias is found to be changed significantly during the classification process, distribution of bias within the wafer is rearranged so as to make it uniform again, in the subsequent wafer processing. In this way, this feedback control of the bias uniformity can lead to maintaining a good manufacturing yield. A method for compensating the uniformity of bias is realized by controlling the mixing ratio of the dual frequency bias. The changes in distribution of poly-Si etching rate when the mixing ratio ($Vpp_H/(Vpp_H+VPP_L)$) of the low frequency (400 kHz: $Vpp_L$) and high frequency (13.56 MHz: $Vpp_H$) is varied to 0%, 20% and 100% are illustrated in FIGS. 8A, 8B and 8C. The etching conditions utilize a processing gas of $HBr/O_2$ with a pressure of 3 Pa and an UHF power of 500 W.

When a bias power with 0% mixing rate of 13.56 MHz is supplied, the concave distribution of poly-Si etching rate is 11% (FIG. 8A). When a bias power with 20% mixing rate of 13.56 MHz is supplied, the middle high distribution of poly-Si etching rate is 0% (FIG. 8B). When a bias power with 100% mixing rate of 13.56 MHz is supplied, the middle high distribution of poly-Si etching rate is 12% (FIG. 8C). In other words, as the mixing rate of high frequency bias power of 13.56 MHz increases, the distribution at near the wafer edge is raised, so that the distribution on the wafer plane can be controlled by adjusting the bias mixing ratio, for example, by supplying a bias with a mixing rate of 97% to achieve an convex distribution of 12%.

Figure 8D:
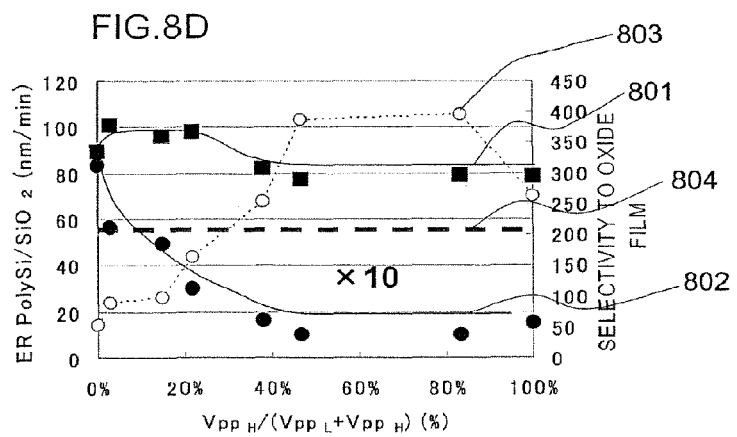
FIG. 8D is a mixing ratio dependency of the poly-Si rate, $SiO_2$ rate and selectivity.

FIG. 8D shows the result of measurement of a poly-Si etching rate 801 and an $SiO_2$ etching rate 802 on a 200 mm wafer by varying the mixing ratio of monitor voltages $Vpp_H$ and $Vpp_L$ of high frequency bias of 13.56 MHz and a low frequency bias of 400 kHz so that $Vpp_H+Vpp_L$ is substantially constant. The $SiO_2$ etching rate 802 is decoupled in the drawing. As the mixing ratio of high frequency bias of 13.56 MHz is increased, the poly-Si etching rate is almost constant within about 20% range, whereas the $SiO_2$ etching rate is reduced significantly, and the selective property with respect to the oxide film (selectivity) 803 is increased. As described, by varying the mixing ratio of biases in order to control the etching rate uniformity across the wafer, the mixing ratio should preferably be 30% or greater to achieve a high selectivity area capable of sufficiently enduring OE (above line 804 of selectivity 200). The above control method can also be combined with other means for controlling the etching rate or correcting the uniformity of the etched profiles, such as controlling the output of an electromagnet 104, controlling the gas flow distribution, or controlling the temperature distribution of the wafer stage.

Further, if only the low frequency impedance and high frequency impedance of the chamber wall surface are varied during the same etching step as the number of processed wafers increases, it is judged either by an observer or by the control unit 125 that the chamber wall condition is varied, based on this judgement, in-situ plasma cleaning is performed either automatically or manually, or components of chamber are replaced, or the output of the IEDF control mechanism 127, the UHF power supply 101, the high-speed response pressure control mechanism 110, the high-speed response reactive gas supply mechanism 111 and the temperature control mechanism 115 are changed according to a model for compensating for the fluctuation.

Heretofore, an example has been described in which the status of the apparatus or the status of the wafer processing is classified based on the impedance above the wafer or impedance of the chamber wall surface, or based on the low frequency bias impedance or the high frequency bias impedance. However, by further considering the data regarding the variation direction, such as whether the change is directed toward an inductor or toward a conductor, it becomes possible to perform a more detailed classification, form a more detailed database and extract the cause of the fluctuation, so as to perform a better feedback control corresponding to the cause of the fluctuation.

As described, by using an IEDF control bias having two frequencies mixed for the etching step such as the ME step or the endpoint detection step that influences the processed shape greatly, and by measuring, storing and comparing the impedance with past database or fluctuation model, it becomes possible to perform an automatic correction of the fluctuation of etching performance.

Figure 9:
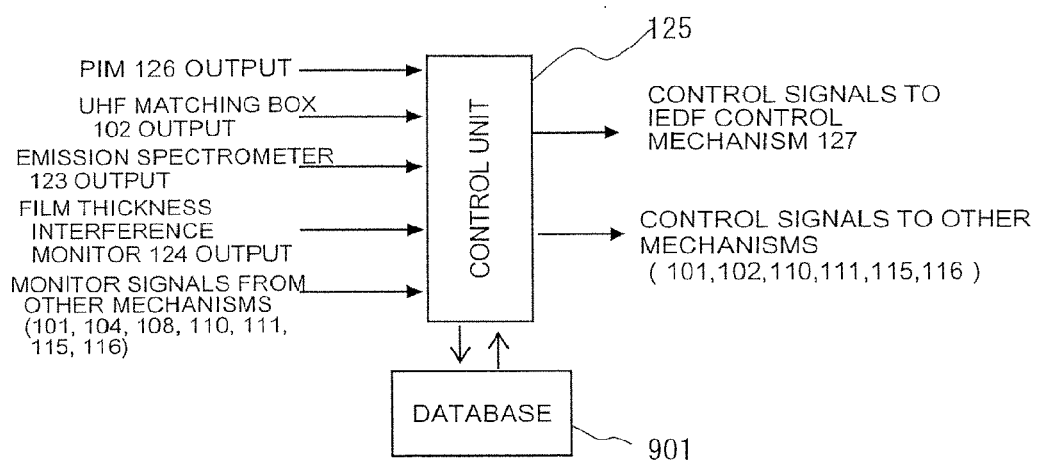
FIG. 9 is a view showing the mechanism for realizing the flowchart of FIG. 7.

A mechanism for realizing this method is shown in FIG. 9. A database 901 is connected to a control unit 125. The input signals to the control unit 125 are not restricted to the outputs from the plasma impedance monitor 126 in the bias supplying mechanism 117 as described in embodiments 1 and 2. In other words, input signals to the control unit 125 may include output (emission spectrum) from a prior-art plasma emission spectrometer 123, output (such as impedance, current, voltage and phase of plasma observed via plasma generation frequency) from a high-speed response UHF matching box 102 with an impedance monitor, output (residual film on wafer) from a film thickness interference monitor 124, and various monitored values from other mechanisms such as a UHF power supply 101, an electromagnet 104, a heater 108, a high-speed response pressure control mechanism. 110, a high-speed response reactive gas supply mechanism 111, a temperature control mechanism 115 and a DC power supply 116. The control unit 125 stores the respective input data. The control unit 125 compares the past data stored in the database 901 with the newly input data, and based on the result of verification of the data with the fluctuation model stored in the database 901 or the control unit 125, outputs control signals to the IEDF control mechanism 127 or other various control mechanisms. As described, by referring not only to the information on the plasma impedance monitor 126 corresponding to the plural frequencies according to the present invention but also to monitored values of various control mechanisms such as the emission spectrum, it becomes possible to perform a more detailed classification of the status of the apparatus or the status of wafer processing, and to perform appropriate action.

[Embodiment 4]

Figure 10A:
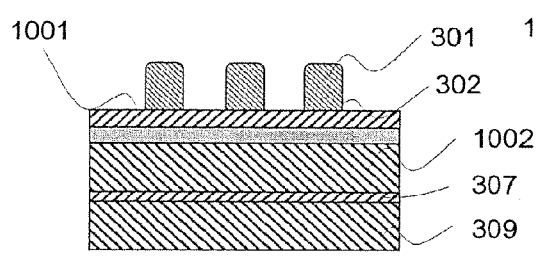
FIG. 10A is a view prior to etching.

Next, with reference to FIG. 10, an embodiment for processing a CMOS gate as shown in FIG. 10A having a multilayered structure including a planar ArF resist 301/BARC 302/TEOS (hard mask) 1001/poly-Si 1002/HfSiO$_2$ 307 on a Si substrate 309 according to the present invention will be described.

Figure 10B:
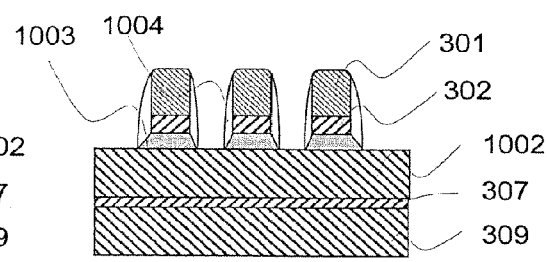
FIG. 10B is a view showing the hard mask etched using a high frequency bias according to the prior art method.
Figure 10C:
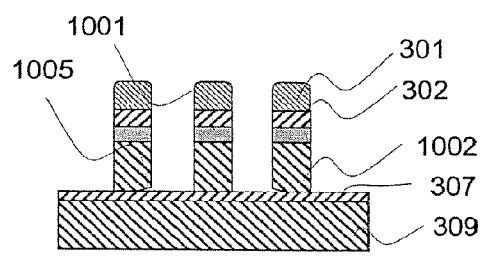
FIG. 10C is a view showing the gate etching performed by the high frequency bias according to the prior art method.
Figure 10D:
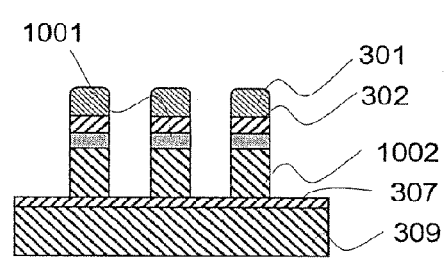
FIG. 10D is a view showing the gate etching performed by multiple high frequency bias according to the present invention.

FIG. 10A is a cross-sectional view prior to etching of a planar CMOS having a multilayered mask structure including a hard mask, FIG. 10B is a cross-sectional view of the same subjected to hard mask etching using a high frequency bias according to a prior art method, FIG. 10C is a cross-sectional view of the same subjected to gate etching using a high frequency bias according to the prior art method, and FIG. 10D is a cross-sectional view of the same subjected to etching according to the present invention.

FIG. 10B is an example showing the Si wafer illustrated in FIG. 10A having a hard mask 1001 disposed below a BARC layer 302 and a poly-Si gate electrode layer 1002 disposed below the hard mask being subjected to a prior art process in which a relatively high frequency of 26 MHz or 13.56 MHz (single frequency bias power supply) is used to etch the hard mask pattern 1001. As illustrated, a side wall protection film 1004 is attached to the hard mask 1001, forming a tapered shape 1003. Further, as shown in FIG. 10C, notching 1005 occurs at a boundary between the lower portion of the poly-Si gate electrode layer 1002 and the HfSiON gate dielectrics 307 at a dense pattern portion, and a partial insulation breakdown often occurs at the base HfSiON gate dielectrics 307.

The following describes an example of etching a 12-inch wafer having a cross-sectional structure illustrated in FIG. 10A by supplying the plasma impedance monitor 126 and the IEDF control bias according to the present invention. An Si wafer 112 having a cross-sectional shape as shown in FIG. 10A is placed on the lower electrode 113 of the etching apparatus illustrated in FIG. 1 to perform trimming and etching processes.

Figure 11:
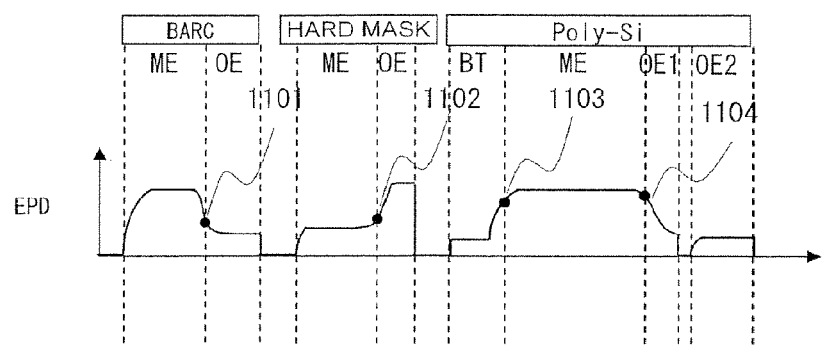
FIG. 11 is a time sequence chart of the EPD and dual frequency bias used for processing the Si wafer having a cross-sectional structure as illustrated in FIG. 10A.
Figure 11:
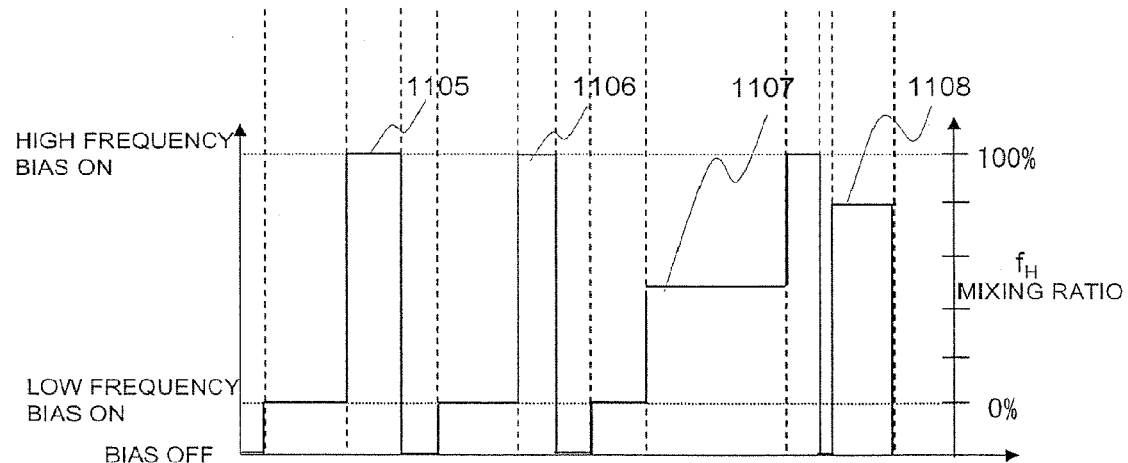

FIG. 11 is referred to in describing the operation for supplying a dual frequency bias to perform the above trimming and etching processes. FIG. 11 is a graph showing the variation by time of the operations of the processes performed in the plasma processing apparatus according to the embodiment shown in FIG. 1. The graph is a time sequence chart showing the operation in the vertical axis and time in the horizontal axis. In the present drawing, the trigger of the operation of the plasma processing apparatus of FIG. 1 is either the end point detection process using the present invention as described in embodiments 1 and 2 or the output waveform from the plasma emission spectrometer 123, and the vertical axis of emission intensity of FIG. 11(a) is a relative value. Further, FIG. 11(b) shows the on/off states of the biases of the two frequencies respectively and the mixing ratio of the high frequency bias power.

In the ME step of BARC 302, halogen-based gas (such as CF$_4$, CHF$_3$, CH$_2$F$_2$, CH$_2$Cl$_2$, Cl$_2$, HBr and HCl) is added to O$_2$/Ar gas so that the total gas flow rate is approximately 100 ccm to 400 ccm and the pressure is 0.8 Pa to 10 Pa, and UHF power output of 500 W to 800 W is supplied to generate plasma. The plasma uniformity accross the 12-inch wafer plane is controlled by the current value of multiple electromagnets 104. After plasma is ignited, as shown in FIG. 11(b), the output of a 400 kHz low frequency bias power supply unit 120 of approximately 30 W to 50 W is supplied, so as to trim the resist 301 while etching the BARC layer 302 (ME process of BARC). At this time, no high frequency bias of 13.56 MHz is supplied, and the mixing ratio of the high frequency bias is 0%.

By utilizing a low frequency IEDF 203 of 400 kHz, low energy ions become incident on the feature sidewall, according to which isotropic trimming can be performed efficiently, while at the same time, high energy ions trim off and reduce the line edge roughness (LER) of the side walls. The amount of trimming performed at this time is controlled appropriately through gas mixture ratio and pressure, plasma source power (output of UHF power supply 101), lower electrode temperature and OE time. An inflection point of the emission intensity of CN 387 nm of the plasma is used to determine an end point 1101 of the BARC ME.

After detecting the end point of BARC ME, the BARC is over-etched (OE). During OE, the bias power is reduced by approximately 10 W and the output is switched to high frequency bias of 13.56 MHz, so that the mixing rate of low frequency bias is 0% and the rate of high frequency bias is 100% (OE processing of BARC).

In the ME step of TEOS 1001 as hard mask, gases selected from $SF_6$, $CF_4$, $CHF_3$, $CH_2F_2$, $O_2$, Ar and He are mixed with a total gas flow rate of 100 ccm to 400 ccm and pressure of 0.4 Pa to 1.5 Pa, and an UHF output of 500 W to 800 W is supplied to generate plasma, wherein etching is performed with the lower electrode bias power set to 80 W to 150 W (ME processing of hard mask). The output from the low frequency bias power supply unit having a high energy peak and broad IEDF is used with a mixing ratio of 100% as the bias power frequency. The reason for such arrangement is to suppress the re-dissociation of reaction products near the wafer even during supplying of high power required for TEOS etching. By suppressing re-dissociation, the processing is performed perpendicularly as shown in FIG. 10D, instead of leaving a hard mask with a tapered shape 1003 and a isolated-dense shape difference as shown in FIG. 10B. When using a low frequency bias and high power, ion bombardment occurs not only to the wafer but also to chamber wall, by which the etched wall material and other reaction products stick to the surface of the quartz, causing drift of etching performance and particles. Sputtering of chamber wall can be reduced by increasing the mixing ratio of high frequency within the range maintaining the uniformity across the wafer without causing excessive dissociation.

At the end point 1102 of hard mask etching, the process is switched to OE. In the OE step, the mixing ratio of high frequency is switched to 100% with the aim to improve selectivity with respect to the underlayer poly-Si 1002, and the processing time is set to correspond to the STI step portion (OE process of hard mask).

Thereafter, a breakthrough (BT) step of the poly-Si 1002 is started. The plasma conditions of the BT process of the poly-Si are as follows: a single gas or a gas mixture selected from $Cl_2$, HBr, $O_2$, Ar and He; a total flow rate of 200 to 300 ccm; a pressure of 0.4 to 0.8 Pa; a UHF output of 500 W to 700 W. As for the conditions of the IEDF control mechanism 127, a 400 kHz low frequency bias is supplied for 100% (BT process of poly-Si). According to these conditions, the high energy ions remove the carbon-based substances, oxide substances at the bottom surface of the pattern, while low energy ions remove the protection layer deposited on the side walls of the pattern. In poly-Si etching, the processed shape influences the device performance greatly, so an endpoint detection is performed by the method according to the present invention described in embodiments 1 and 2.

An IEDF with a 50% ratio of 13.56 MHz high frequency is used for the ME of poly-Si 1002 (ME process of poly-Si). The endpoint 1104 of the ME of poly-Si is acquired based on signals from the plasma impedance monitor 126 in the method described in embodiment 2.

After detecting the end point of ME process of poly-Si, an OE process is performed. This OE process is composed of two steps S, an OE1 and an OE2. In OE1 step, a low pressure condition is preferred so as to realize both underlayer selectivity and vertical etched profile without footings. It is generally required to reduce the ion energy in order to achieve a good underlayer selectivity under a low pressure condition. But if a low frequency of 400 kHz is selected, the ion directivity became isotropic because of the existence of low energy ions shown in FIG. 2, causing residual footings. Therefore, in the OE1 step, the same processing gas as ME is used and an IEDF having a 100% mixing ratio of 13.56 MHz high frequency bias is used (OE1 process of poly-Si). The bias power is from 10 to 50 W (equal to or smaller than Vpp 250 V).

Then, the procedure advances to OE2 step in which the poly-Si at the STI step portion, the p/n gate difference and the isolated-dense pattern difference is removed. The plasma conditions for the OE2 step are as follows: $HBr/O_2$ gas diluted by Ar used as processing gas; a total flow rate of 200 to 400 cc; a pressure of 3 to 10 Pa; and UHF output of 500 to 700 W. A dual frequency bias is used in which two frequencies are mixed with a high frequency bias ratio of 80% and a low frequency bias ratio of 20% (OE2 process of poly-Si). These conditions are selected with the aim to realize both underlayer selectivity and reduced electron shading. In other words, by reducing the ratio of high ion energy which is almost dual the average ion energy, it becomes possible to maintain underlayer selectivity and also suppress physical damage by ion bombardment. Further, by neutralizing the electrons charged on the upper portion of the mask with low energy ions, it becomes possible to prevent notching caused by electron shading.

Figure 15:
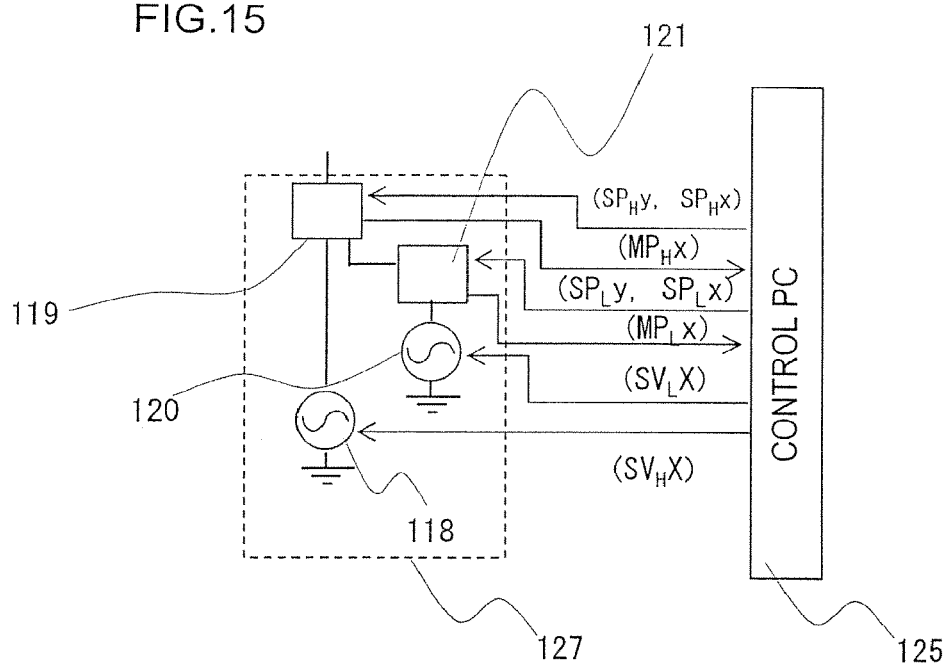
FIG. 15 is a drawing showing the outline of the structure of a control unit of the plasma processing apparatus according to the embodiment shown in FIG. 1.

The above description illustrates an example of the setting of the IEDF control mechanism 127 for transiting from one step to a subsequent step using as trigger the signals from the plasma impedance monitor 126, the emission spectrometer 123 or the film thickness interference monitor 124 when the material to be etched in the multilayered etching sample is varied. FIG. 15 illustrates an outline of the arrangement of a control unit for preventing deterioration of selectivity caused by overshooting of output voltage (Vpp) of the IEDF control power supply and having excessive voltage supplied on the material to be etched during transition of steps.

FIG. 15 is a pattern diagram illustrating the outline of the functional configuration of a control unit of the plasma processing apparatus according to the embodiment shown in FIG. 1. Based on the etching recipe set up in advance, the output voltage and timing of the IEDF control mechanism 127 are controlled by a control unit 125 for controlling the outputs and timings of the plasma source power supply (UHF power supply 101), the high-speed response pressure control mechanism 110 and the high-speed response reactive gas supply mechanism 111. During at least an X-1th etching step, the IEDF control mechanism 127 has set thereto in advance via signals from the control unit 125 the output value SVHx of the high frequency bias power supply unit 118 and the output value SVLx of the low frequency bias power supply unit 120 for the Xth etching step, and stabilization point setting SPHx of the high frequency matching unit 119 and stabilization point setting SPLx of the low frequency matching unit 121 for the Xth etching step.

At this time, by further setting a plurality of transitional stabilization point settings SPHy of the high frequency matching unit 119 and a plurality of transitional stabilization point settings SPLy of the low frequency matching unit 121 from the end of the X-1th step to the Xth step, it becomes possible to realize a smooth response without causing overshoot or undershoot or other problems when transiting from the X-1th step to the Xth step. Further at this time, feedback control can be performed by outputting the transitional settings SPHy and SPLy and power supply output values SVHx and SVLx based on the monitored values MPHx and MPLx during transition, such as the input power and reflection power from the load or the alignment condition. The feedback control can also be performed not only based on signals from the high frequency matching unit 119 and the low frequency matching unit 121 but also based on monitored signals of voltage, current, phase and impedance from the plasma impedance monitor 126, or can be performed by referring to past data stored in the database 901. The mechanism and method described above for performing a smooth transient without overshoot or undershoot to a subsequent target point in a short period can be applied similarly to the UHF power supply 101, the high-speed response pressure control mechanism 110, the high-speed response reactive gas supply mechanism 111 and the temperature control mechanism 115.

[Embodiment 5]

Figure 12A:
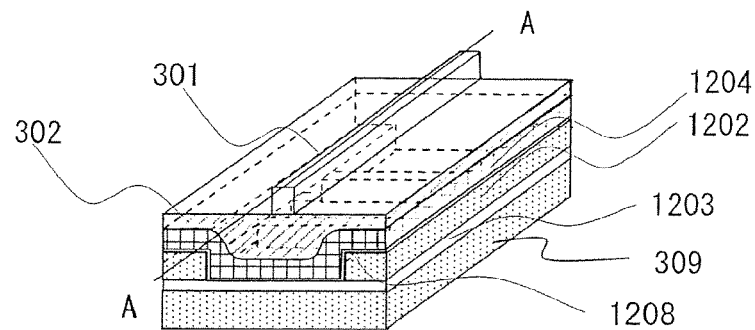
FIG. 12A is a perspective view showing the state prior to etching.
Figure 12B:
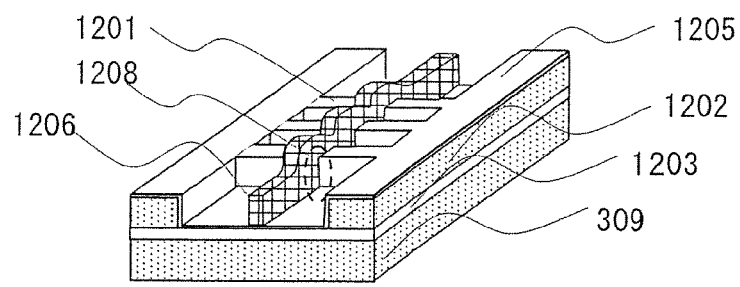
FIG. 12B is a perspective view showing the gate etching performed according to the present invention.
Figure 12C:
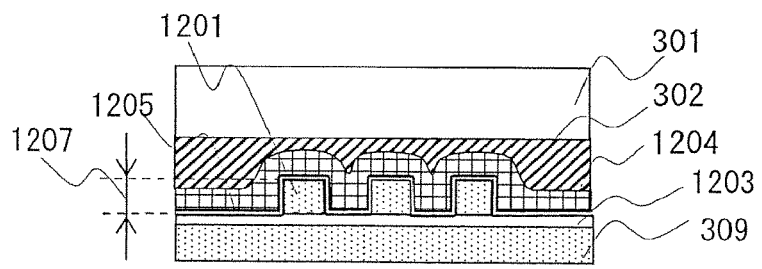
FIG. 12C is an A-A' cross-section.

Next, an embodiment of a processing method for forming a three-dimensional FIN-FET structure having a high step as shown in FIG. 12 using the plasma processing apparatus of FIG. 1 will be described. FIG. 12A is a perspective view showing the film structure prior to etching, FIG. 12B is a perspective view showing the film structure after performing etching according to the present embodiment, and FIG. 12C is a vertical cross-sectional view taken at line A-A of FIG. 12A.

In FIGS. 12A and 12C, the film structure prior to etching the three-dimensional FIN-FET structure having a high step includes an $SiO_2$ layer 1203, an Si layer 1202, a TiN layer 1204, a BARC 302 and a resist 301 formed on an Si substrate 309. A FIN potion 1201 is formed on the $SiO_2$ layer 1203, and on the $SiO_2$ layer 1203 and the FIN portion 1201 is formed a high-k dielectrics 1205. Reference number 1208 denotes the corner portion between the FIN portion 1201 and the gate electrode. The present embodiment relates to a dry etching process in which etching is performed using the resist 301 of the film structure of FIG. 12A as mask so as to obtain the film structure shown in FIG. 12B. In FIG. 12B, reference number 1205 denotes a high-k dielectrics, reference number 1206 denotes a TiN gate electrode formed by etching the TiN layer 1204. And the Si layer 1202 positioned on both sides of the TiN gate electrode 1206 includes a plurality of FIN portions 1201 extended toward the TiN gate. The vertical cross-section of the film structure of FIG. 12A including the FIN portion 1201 is illustrated in FIG. 12C.

In a wafer having the structure as shown in FIG. 12A, there is a great difference of OE amount between the top and the bottom of the FIN portion 1201, and the gate length portion having a significant influence on the device performance is disposed perpendicularly, so that not only the IEDF control described in embodiments 1 through 4 but also the control of the transition phenomenon between steps related to the flux of reaction products, etchants and ion operated with gas chemistry, pressure, power supply, matching box and electrode temperature becomes important.

As for the mechanism for following the transition phenomenon during etching, the high-speed response UHF matching box 102 should preferably have a performance capable of stabilizing a monotone increase or monotone decrease variation in approximately 1 second without causing overshoot or undershoot of plasma incident power during continuous discharge between steps. Such performance can be realized for example by providing a function to set up the optimum values for the plurality of matching parameters, such as the ignition point and stabilization point and the matching paths thereof. The definition of monotone increase is that the temporal differentiation of the response curve is always positive, and the definition of monotone decrease is that the temporal differentiation of the response curve is always negative.

Moreover, in order to follow the transition phenomenon of the flux of the reaction products or etchants, the high-speed response reactive gas supply mechanism 111 should preferably have a mechanism capable of preventing overshoot and undershoot of the flow rate when adding or cutting gas supply during plasma discharge, such as a mechanism enabling gas to be fed continuously during wait time so as to prevent gas from accumulating and bursting out.

Furthermore, it is preferable to provide a high-speed response pressure control mechanism 110 for stabilizing the pressure in approximately two seconds following the pressure fluctuation of plasma that accompanies the change in gas flow rate. Such function can be realized for example by providing a gas pipe structure capable of reducing as much pressure difference as possible, or by optimizing the pressure control algorithm. Further, in order to follow the change in the Si wafer in-plane distribution of reaction products, it is preferable that the lower electrode 113 has a function to enable the temperature to be raised or lowered at a highest possible speed (1° C./sec or faster) between steps and to enable the temperature of the inner and outer or more portions thereof to be controlled independently. This function can be realized for example by providing a temperature control mechanism 115 having a heater, a temperature sensor, an He gas pressure control mechanism and the like in the interior of the lower electrode.

Figure 13:
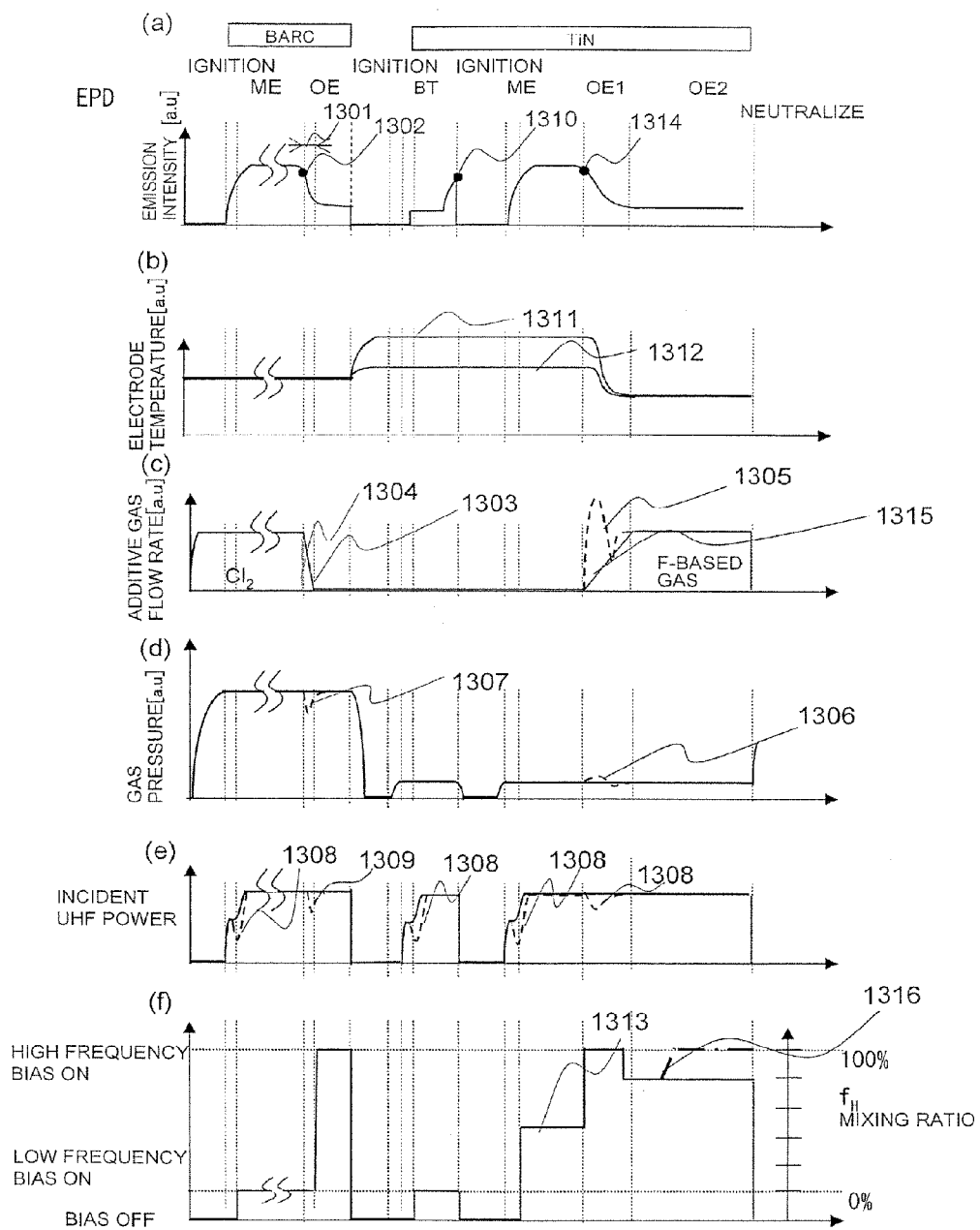
FIG. 13 is a chart showing the time sequence used for processing the FIN-FET, wherein (a) shows the EPD waveform, (b) shows the temperature of the lower electrode, (c) shows the additive gas flow rate, (d) shows the gas pressure, (e) shows the incident UHF power, and (f) shows the distribution ratio of the IEDF control mechanism.

FIG. 13 is a time sequence of the etching process for etching a FINFET formed on a SOI (Si on insulator) substrate using the etching apparatus shown in FIG. 1 having functions described above. FIG. 13(a) is a time variation of the signals for EPD using emission intensity, for example, FIG. 13(b) is a temperature of a lower electrode 113 during processing, FIG. 13(c) is a flow rate of additive gas supplied to the etching chamber 107, FIG. 13(d) is a gas pressure within the etching chamber 107, FIG. 13(e) is a UHF power supplied from the antenna 103 to the etching chamber, and FIG. 13(f) is a graph showing the distribution ratio of biases by multiple frequencies performed by the IEDF control mechanism 127.

The initial settings of the temperature control mechanism 115 for controlling the electrode temperature of the lower electrode 113 are set so that the inner portion 1311 and outer portion 1312 are both set to 40° C., as shown in FIG. 13(b). At first, the ME step of the BARC layer 302 is performed according to the process illustrated in embodiment 4 using $O_2/Cl_2/Ar/CF_4$, and the process is advanced to the OE step of the BARC at a time 1302 when the plasma emission intensity starts to reduce. During OE, it is necessary to realize high selectivity against underlayer TiN 1204, so that $Cl_2$, which is the etchant of TiN, is gradually monotonically reduced by ramp control before the passing of time 1301 when the emission intensity drops completely (1303). Since according to the prior art gas flow rate control waveform 1304, $Cl_2$ gas was merely controlled by the opening and closing of an air operation valve, the gas was reduced instantaneously. Further according to the prior art, the pressure fluctuation 1307 of the plasma was reduced significantly when the stop valve of the $Cl_2$ gas was closed instantaneously, and then the pressure was returned to the set pressure in approximately 5 seconds.

On the other hand, the present embodiment utilizes the high-speed response reactive gas supply mechanism 111 and the high-speed response pressure control mechanism 110 to gradually reduce the etchant flux in correspondence with the decrease in reaction products, and to correct the pressure fluctuation caused thereby to achieve a constant pressure. Since the pressure is constant, the fluctuation 1309 of the plasma injection power generated by the prior art UHF matching box can be suppressed, and the fluctuation of Vpp can also be suppressed, by which abnormal profiles can be prevented.

Further, the frequency of the IEDF control mechanism 127 during OE of BARC is switched from the low frequency of 400 kHz to the high frequency of 13.56 MHz, similar to the first embodiment. The range of bias output is between 30 and 50 W. After performing the OE process during the time required for etching the FIN step 1207, the procedure is advanced to the BT step of the TiN layer 1204. At this time, the UHF wave output and the bias power were turned off once in order to replace gases. During the ten or more seconds for replacing gases by stopping discharge, the electrode temperature 1311 of the inner portion during etching of TiN is raised by 20° C. This is for preventing the re-deposition of reaction products reentered during the TiN etching. Further, the temperature 1312 of the outer portion of the lower electrode 113 is set 10 to 20° C. lower than the inner portion, considering the difference in distribution of reaction products due to the exhaust efficiency.

The TiN layer processing is composed of BT, ME, OE1 and OE2, and as for BT and ME, the end point detection and etching conditions described in embodiment 1 of the present invention are supplied.

By supplying a prior art UHF matching box, a fluctuation 1308 of plasma injection power during ignition of plasma appears during transition to a BT step S, but by adopting a high-speed response UHF matching box 102, the transition can be performed smoothly without causing overshoot or undershoot of incident power. This is because when the high-speed response UHF matching box 102 is transited to different matching parameters during ignition and during stabilized condition, the matching paths thereof can be set arbitrarily.

In the BT step, BT processing gas is supplied while supplying UHF power, and low frequency bias is supplied. When the end 1310 of the BT step is detected, the supply of BT processing gas is stopped, and the supply of UHF power and low frequency bias power are stopped.

In the following ME step, ME processing gas is supplied while the supply of UHF power to the antenna is started, whereas the bias power is set so that the ratio of low frequency bias power to high frequency bias power is 1:1. In the ME step, the procedure is switched to OE1 step of TiN at a time 1314 when the impedance of the plasma impedance monitor 126 starts to drop.

The OE1 step is for aligning the etching depth varied due to STI or FIN steps, pattern density and non-uniformity across the wafer. In other words, there exist in mixture within the wafer, the portions in which the etching has reached the underlayer and the portions in which the etching has not yet reached the underlayer. Therefore, it is necessary to maintain high selectivity against the high-k material where the etching has reached the underlayer, while reducing the tapered shapes and footings at portions where etching has not yet reached the underlayer, especially in the perpendicular gate length portions like FINFET. In order to improve selectivity against Hf based high-k material, an F-based gas is controlled to be added in a monotonically increased manner in correspondence with the quantity of gradually reducing reaction products, as shown in FIG. 13(c). Gases such as $NF_3$, $SF_6$, $CF_4$, $O_2$, $N_2$ and $CH_2Cl_2$ can be used as additive gas, considering the underlayer and gate material. When the gate electrode/gate dielectrics structure is poly-Si/$SiO_2$, oxygen or nitrogen can be used to realize equivalent effects. At this time, via the high-speed response reactive gas supply mechanism 111, the high-speed response pressure control mechanism 110 and the high-speed response UHF matching box 102, it becomes possible to add these gases without causing overshoot 1305 of gas flow rate, pressure fluctuation 1306, fluctuation 1308 of incident UHF waves and fluctuation of Vpp. During OE1, the IEDF control mechanism 127 uses a 100% high frequency mixing ratio so as to achieve a narrow energy distribution for improved selectivity, by which the isolated-dense pattern difference and P/N gate difference can be reduced without causing abnormal profiles such as side-etch and underlayer penetration at the opening portions.

According further to the present embodiment, the lower electrode temperature is lowered by 20° C. at the endpoint 1314 of the ME of TiN, so as to increase the sticking probability of reducing reaction products and by-products and increase the deposition amount for realizing selectivity. This operation suppresses the occurrence of side-etch caused by the rising of etchant ratio due to the decreased reaction products.

On the other hand, during OE2, the TiN remaining at the corner portion 1208 between the FIN portion and the gate electrode must be removed. Since the portion constitutes agate length, highly accurate control is required for the process. Therefore, the ratio of the 13.56 MHz high frequency of the dual frequency bias 1313 is set to 80% Vpp, and the total power supply output is set so that the average of IEDF is 50 V or smaller (100 Vpp or smaller). This is because high selectivity is required with respect to the high-k dielectrics on the top portion of the FIN. Further, the corner portion 1208 between the gate electrode 1206 and the FIN portion 1201 must be etched from above the corner by using also proper amount of low energy ions. Selectivity and etching can be realized simultaneously by controlling the total output of bias to 100 Vpp or smaller. The bias power at this time is approximately 1 W/12-inch.

In order to ensure further OE time, it is effective to use a ramp control waveform 1316 for increasing the mixing ratio to realize higher selectivity in response to the gradually reducing height of the edge portion during OE2. Further, the dual-frequency mixing ratio during the BARC etching and TiN etching should be controlled arbitrarily according to the pattern density and FIN height (step height).

Further, similar to the high-frequency response UHF matching box 102, the high frequency matching unit 119 and the low frequency matching unit 121 within the IEDF control mechanism 127 should have steps for arbitrarily setting a plurality of matching points and their matching paths so as to prevent hunting, overshoot or undershoot of ion energy, Vpp and output power. And it is preferable to adopt an algorithm for controlling the respective mechanisms so that the inner parameters of plasma influencing the etching reaction directly, such as the radical species and density, ion density and incident ion energy, are transited smoothly by monotone increase or monotone decrease, so that the ion assisted etching is transited smoothly. The inner parameters of plasma are indications of the properties of plasma, and the parameters should preferably be controlled by preparing a plurality of transition points using feedback control via signals from the emission spectrometer 123 or a new density detecting probe for the radical species or density and ion density, and via signals from the plasma impedance monitor 126 for the incident ion energy, or by referring to a database in advance. At this time, it is important to change the settings of respective mechanisms simultaneously without causing diffusive control during transition of steps.

[Embodiment 6]

Next, FIG. 14 illustrates an example of processing and forming a film structure other than the gate electrode in a plasma processing apparatus using a μ-wave ECR apparatus. In this embodiment, an example is described for forming deep holes on an Si substrate 309 as shown in FIG. 14A. The etching steps of the present embodiment are composed of steps for etching BARC 302, hard mask 1001 and Si 309, wherein the step for etching the BARC layer 302 and the hard mask 1001 is composed of ME and OE processes in the manner described in embodiment 4. Thereafter, F-containing gases such as $SF_6$, $CF_4$, $CHF_3$, $CH_2F_2$, $SiF_4$ and $SiCl_4$ are mixed for example with oxygen, and plasma is generated by setting a gas flow rate of 100 ccm to 300 ccm with a pressure of 0.4 to 1.5 Pa and a μ-wave output of 500 to 1000 W of the plasma generating mechanism, and the etching of the Si layer is performed with the inner/outer temperature difference of the electrode set so that the temperature of the inner portion is approximately 5 to 20° C. higher than that of the outer portion. Reference number 1401 shown in FIG. 14B denotes trenches formed after the etching of the hard mask.

Figure 14A:
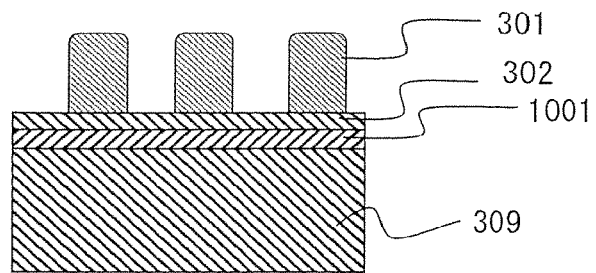
FIGS. 14A, 14B, 14C and 14D show deep holes processed according to the present invention.
Figure 14B:
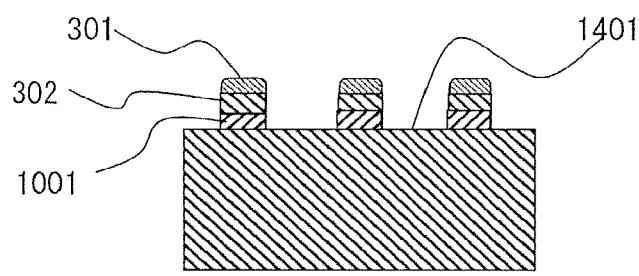
Figure 14C:
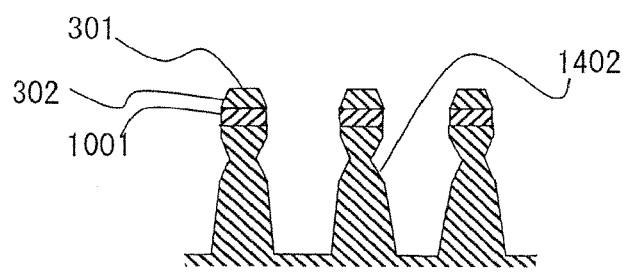
Figure 14D:
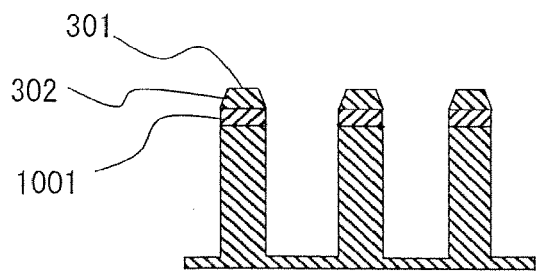

According to the present embodiment, the IEDF control mechanism 127 utilizes 100% of 13.56 MHz high frequency component for realizing a narrow ion energy distribution. This arrangement is for preventing the ion energy having low energy existing in a low frequency IEDF from enhancing bowing 1402 of the Si layer as shown in FIG. 14C. Further, by aligning the energy distribution, it becomes possible to prevent the increase of facet angle of the resist and prevent the deep hole dimension from expanding, and thus it becomes possible to perform a highly accurate hole processing with no bowing, as shown in FIG. 14D. As described, a fine, high-aspect processing can be realized by performing a timing control of deposition gases such as oxygen, $SiF_4$ and $SiCl_4$.

The above-described methods and mechanisms of the present invention enable to realize an etching process of gate electrodes of a planar CMOS-FET or three-dimensional FiN-FET structure having a multilayered structure including steps, metal materials and high-k materials, in which the etching process can be performed stably without causing defective shapes such as isolated-dense shape differences, notching, side-etch, underlayer damage, footings, underlayer penetration and tapered shapes.

The embodiments of the present structure have been described with respect to a semiconductor processing of a Si wafer, but the present invention can also be supplied to plasma etching processes in general, such as the processing of plasma displays, liquid crystal panels and MEMS by adopting a correspondingly designed lower electrode 113.

What is claimed is:

1. A plasma processing apparatus comprising a vacuum reactor, a lower electrode placed in a processing chamber of the vacuum reactor and capable of having placed thereon a wafer, a bias supplying mechanism for supplying a bias power of a plurality of different frequencies to the lower electrode, a gas supply mechanism for introducing a reactive gas into the processing chamber, a pressure control mechanism for controlling a pressure in the processing chamber, an electromagnetic wave supplying mechanism for supplying electromagnetic wave for generating plasma in the processing chamber, and a control device which respectively controls the bias supplying mechanism, the gas supply mechanism, the pressure control mechanism, and the electromagnetic wave supplying mechanism, wherein the bias supplying mechanism comprises an ion energy distribution control mechanism for controlling a distribution of energy of ions being incident on the wafer, and a plasma status detector configured to detect a time variation of an impedance of the plasma when a high-frequency bias power of a plurality of different frequencies are supplied to the wafer, and isolate the detected time variation of impedance of the plasma into an impedance of a component of a wall surface status of the processing chamber and an impedance of a component above the wafer, and the control device is configured to determine an end point of plasma processing of the wafer based on a time variation of either the isolated the impedance of the component above the wafer or the isolated impedance of the component of the wall surface status of the processing chamber.

2. The plasma processing apparatus according to claim 1, wherein the bias supplying mechanism comprises a power supply unit for oscillating a plurality of frequencies, a matching box corresponding to the plurality of frequencies, and an impedance detector with respect to the plurality of different frequencies, or comprises a power supply unit for oscillating a plurality of different frequencies, a matching box corresponding to the plurality of frequencies, and a mechanism for detecting a current, a voltage and a phase with respect to the plurality of different frequencies.

3. The plasma processing apparatus according to claim 1, wherein the plasma state detector isolates the detected time variation of impedance of the plasma into the impedance of the component of the wall surface status of the processing chamber and the impedance of the component above the wafer, using equation (1) in which the voltage, the current, the impedance of the component above the wafer, and the impedance of the wall state component of the processing chamber at the time when the high frequency bias power of high frequency is supplied are respectively represented by $V_H$, $I_H$, $Z_{1H}$, and $Z_{2H}$, equation (2) in which the voltage, the current, the impedance of the component above the wafer, and the impedance of the wall state component of the processing chamber at the time when the high frequency bias power of low frequency is supplied are respectively represented by $V_L$, $I_L$, $Z_{1L}$, and $Z_{2L}$, and equation (3) in which an angular speed of the high frequency bias of high frequency and an angular speed of the high frequency bias of low frequency are represented by $\omega_H$ and $\omega_L$, the impedance of the component above the wafer at the time when the high frequency bias power of high frequency is supplied, the impedance of the component above the wafer at the time when the high frequency bias power of low frequency is supplied, a resistance component, a reactance component, an inductance component and a capacity component of the component above the wafer are respectively represented by $Z_{1H}$, $Z_{1L}$, $R_1$, $X_1$, $L_1$, and $C_1$, and the impedance of the wall state component of the processing chamber at the time when the high frequency bias power of high frequency is supplied, the impedance of the wall surface component of the processing chamber at the time when the high frequency bias power of low frequency is supplied, a resistance component, a reactance component, an inductance component, and a capacity component of the wall state component of the processing chamber are respectively represented by $Z_{2H}$, $Z_{2L}$, $R_2$, $X_2$, $L_2$, and $C_2$

[Equation 1]

$$\begin{cases} Z_{1H} I_H + Z_{2H} I_H = V_H & (1) \\ Z_{1L} I_L + Z_{2L} I_2 = V_L & (2) \end{cases}$$

-continued

[Equation 2]

$$Z_{xy} = R_x + j\left(\omega_y L_x - \frac{1}{C_x \omega_y}\right) \quad (3)$$
$$= R_x + jX_{xy}$$

$x = 1, 2; y = H$ or $L$.

4. The plasma processing apparatus according to claim 1, wherein
the electromagnetic wave supplying mechanism comprises a power supply unit for supplying power for the electromagnetic wave, and a matching unit for storing a plurality of matching points with respect to the power supply unit and for selecting a matching path so as to perform matching.

* * * * *